United States Patent
Marchand et al.

(10) Patent No.: US 10,476,523 B2
(45) Date of Patent: Nov. 12, 2019

(54) ELEMENTARY CHECK NODE-BASED SYNDROME DECODING USING PRE-SORTED INPUTS

(71) Applicant: UNIVERSITE DE BRETAGNE SUD, Lorient (FR)

(72) Inventors: Cédric Marchand, Queven (FR); Emmanuel Boutillon, Lorient (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 15/723,813

(22) Filed: Oct. 3, 2017

(65) Prior Publication Data
US 2018/0115323 A1    Apr. 26, 2018

(30) Foreign Application Priority Data

Oct. 25, 2016 (EP) ..................................... 16306397

(51) Int. Cl.
*H03M 13/11* (2006.01)
*H04L 1/00* (2006.01)

(52) U.S. Cl.
CPC .... *H03M 13/1131* (2013.01); *H03M 13/1117* (2013.01); *H03M 13/1128* (2013.01); *H03M 13/1171* (2013.01); *H04L 1/0041* (2013.01)

(58) Field of Classification Search
CPC .......... H03M 13/1131; H03M 13/1117; H03M 13/1128; H03M 13/1171; H04L 1/0041
See application file for complete search history.

(56) References Cited

U.S. PATENT DOCUMENTS

2006/0107193 A1* 5/2006 Park ................... H03M 13/1105
714/801
2006/0123318 A1* 6/2006 Kim ................... H03M 13/1114
714/758

(Continued)

FOREIGN PATENT DOCUMENTS

EP    2 903 166 A1    8/2015

OTHER PUBLICATIONS

Marchand et al., "NB-LDPC check node with pre-sorted input", 2016 9th International Symposium on Turbo Codes and Iterative Information Processing (ISTC), Date of Conference: Sep. 5-9, 2016, Date Added to IEEE Xplore: Oct. 20, 2016, Conference Location: Brest, France, pp. 196-200. (Year: 2016).*

(Continued)

*Primary Examiner* — Kyle Vallecillo
(74) *Attorney, Agent, or Firm* — Meagher Emanuel Laks Goldberg & Liao, LLP

(57) ABSTRACT

At least a method and an apparatus are presented for decoding a signal. For example, a decoder is presented for determining an estimate of an encoded signal. The decoder comprises one or more variable node processing units and one or more check node processing units configured to exchange messages, each message comprising one or more components, a component comprising a symbol and a reliability metric associated with the symbol. The at least one check processing unit is further configured to calculate at two or more elementary check node processors a set of syndromes from at least three permuted messages, a syndrome comprising a binary vector; generate at least one check node message from the set of syndromes depending on the binary vector, and send the at least one check node message to a signal estimation unit.

25 Claims, 8 Drawing Sheets

(56) References Cited

U.S. PATENT DOCUMENTS

| | | | | |
|---|---|---|---|---|
| 2009/0083604 | A1* | 3/2009 | Tong | H03M 13/1148 714/752 |
| 2010/0037121 | A1* | 2/2010 | Jin | H03M 13/1117 714/763 |
| 2010/0122142 | A1* | 5/2010 | Sun | H03M 13/1122 714/752 |
| 2011/0087946 | A1* | 4/2011 | Planjery | H03M 13/1117 714/752 |
| 2011/0246849 | A1* | 10/2011 | Rault | H03M 13/1128 714/752 |
| 2013/0061107 | A1* | 3/2013 | Wang | H03M 13/1117 714/752 |
| 2013/0139022 | A1* | 5/2013 | Chen | H03M 13/1117 714/752 |
| 2013/0246894 | A1* | 9/2013 | Declercq | H03M 13/256 714/792 |
| 2014/0068367 | A1* | 3/2014 | Zhang | H03M 13/1142 714/752 |
| 2014/0108883 | A1* | 4/2014 | Tehrani | G06F 11/1012 714/758 |
| 2014/0201592 | A1* | 7/2014 | Shen | H04L 1/0041 714/758 |
| 2014/0281787 | A1* | 9/2014 | Wang | H03M 13/13 714/752 |
| 2015/0095726 | A1* | 4/2015 | Cameron | G06F 11/076 714/704 |
| 2015/0326249 | A1 | 11/2015 | Zhang | |
| 2015/0363247 | A1* | 12/2015 | Bisplinghoff | G06F 11/076 714/704 |

OTHER PUBLICATIONS

Li et al., "Low Latency T-EMS decoder for Non-Binary LDPC codes", 2013 Asilomar Conference on Signals, Systems and Computers, Nov. 3-6, 2013, Pacific Grove, CA, USA., pp. 831-835.

Lacruz et al., "One Minimum Only Trellis Decoder for Non-Binary Low-Density Parity-Check Codes", IEEE Transactions on Circuits and Systems—I:Regular Papers, vol. 62, No. 1, Jan. 2015, pp. 177-184.

Rybalkin et al., "A new Architecture for High Speed, Low Latency NB-LDPC Check Node Processing for GF(256)", In Proceedings of IEEE 83rd Vehicular Technology Conference (VTC Spring), Nanjing, 2016, pp. 1-5.

European Search Report for 16306397.7 dated Mar. 28, 2017.

Marchand Cedric et al: "NB-LDPC check node with pre-sorted input", 2016 9th International Symposium on Turbo Codes and Iterative Information Processing (ISTC), IEEE, Sep. 5, 2016 (Sep. 5, 2016), pp. 196-200.

Schlafer Philipp et al: "Syndrome based check node processing of high order NB-LDPC decoders", 2015 22nd International Conference on Telecommunications (ICT), IEEE, Apr. 27, 2015 (Apr. 27, 2015), pp. 156-162.

Schlafer Philipp et al: "A new architecture for high throughput, low latency NB-LDPC check node processing", 2015 IEEE 26th Annual International Symposium on Personal, Indoor, and Mobile Radio Communications (PIMRC), IEEE, Aug. 30, 2015 (Aug. 30, 2015), pp. 1392-1397.

* cited by examiner

| | Number of ECNs | ECNs inputs | ENC outputs |
|---|---|---|---|
| Forward-Backward architecture | 30 | 240 | 600 |
| Tree SB-CN | 11 | 72 | 400 |
| Serial SB-CN | 11 | 72 | 525 |
| Sorted Tree SB-CN | 11 | 31 | 100 |
| Sorted serial SB-CN | 11 | 31 | 105 |

| ECN | Number of occupied slices | Frequency (MHz) | Latency (cycles) |
|---|---|---|---|
| 1B | 7 | 714 | 1 |
| S-1B | 17 | 714 | 1 |
| S-1B+1 | 35 | 349 | 1 |
| S-2B | 82 | 334 | 2 |
| S-4B | 138 | 269 | 2 |

FIGURE 11

| CN GF(64) | Number of occupied slices | Frequency (MHz) | Latency (cycle) |
|---|---|---|---|
| Forward-Backward | 4666 | 250 | 20 |
| Serial SB-CN | 2526 | 208 | 23 |
| Sorted serial SB-CN | 1890 | 214 | 22 |

FIGURE 12

ELEMENTARY CHECK NODE-BASED SYNDROME DECODING USING PRE-SORTED INPUTS

TECHNICAL FIELD

The invention generally relates to digital communications, and in particular to methods and devices for decoding a signal encoded using an error correcting code.

BACKGROUND

Error correcting codes are developed for providing a protection of data against errors that are introduced during data transmission or storage due to noise and/or interference. The protection of data consists in adding redundant data to the original data enabling the detection and/or the correction of errors.

Various devices and systems used for data storage or transmission implement error correcting codes for ensuring a reliable and possibly error-free transfer of data in the presence of noisy transfer media. Exemplary applications comprise voice and multimedia transfer for example in wireless ad-hoc networks (e.g. standardized in Wi-Fi 802.11), in radio communication systems (e.g. in 3G, 4G/LTE, 5G and beyond, etc.), in optical communication systems, and in digital video broadcasting (e.g. standardized in DVB-C2, DVB-S2X, and DVB-T2).

Existing error correcting codes comprise linear codes, generally categorized into linear block codes and convolutional codes. Linear codes refer to codes that satisfy a linearity property according to which any linear combination of codeword vectors is a codeword vector. Linear block codes are widely used because they are less complex and easier to implement than non-linear codes. Exemplary linear block codes comprise Hamming codes, Reed-Solomon codes, Turbo codes and low-density parity-check (LDPC) codes.

LDPC codes are very efficient linear block codes that can provide high transmission rates that approach the optimum channel capacity, i.e. the theoretical maximum amount of information that can be transmitted over a communication channel. In particular, non-binary LDPC codes are very efficient in providing high-spectral efficiency coding and can achieve better error-correction performance than binary LDPC codes.

Given the linearity property, any linear error correcting code can be represented by a generator matrix and a parity-check matrix. The entries of the generator and parity-check matrices belong to the algebraic structure over which the error correcting code is constructed.

The parity-check matrix defines the parity-check constraints designed to be satisfied by the codewords. In particular, LDPC codes are specified by sparse parity-check matrices comprising a number of zero entries which is much higher than the number of non-zero entries.

Decoding data encoded using linear error correcting codes can be performed based on a graph representation of the code, so-called 'Tanner graph', associated with the parity-check matrix of the underlying code. The graph representation of a linear error correcting code comprises two sets of nodes: a first set of nodes referred to as 'variable nodes' and a second set of nodes referred to as 'check nodes'. Variable nodes and check nodes are linked together by edges. Variable nodes and check nodes form processing units. Each variable node is associated with a column of the parity-check matrix. Each check node is associated with a row of the parity-check matrix, i.e. with a parity-check equation. The connections between variable nodes and check nodes are determined by the non-zero entries of the parity-check matrix.

Iterative decoders can be used to decode data encoded using linear block error correcting codes. Given a noisy sequence of encoded symbols representing for example the output of a communication channel, an iterative decoder processes the noisy sequence during a number of iterations bringing it at each iteration closer to the original sequence of encoded symbols.

The Tanner graph representation can be used to implement iterative decoding. Accordingly, the decoding process can be performed by an iterative exchange of messages between the processing units associated with the variable nodes and check nodes via the different edges connecting them in the graph. Each variable node processing unit and check node processing unit receives input messages (check node messages and variable node messages respectively) from the corresponding connected nodes in the graph and delivers, after processing the input messages, output messages to at least one processing unit corresponding to a connected node in the graph (variable node messages and check node messages respectively). The decoding process stops either if all parity-check constraints are satisfied, returning thus the decoded codeword, or by reaching a maximum number of iterations without meeting all parity check constraints.

Passed messages between the different variable node processing units and check node processing units carry information associated with the encoded symbols. A message may comprise symbols and metrics measuring the reliability of the symbols (hereinafter referred to as the 'reliability metric'). The reliability metric of a symbol may correspond for example to its estimated probability density function, measuring the probability that this symbol is equal to each value in the algebraic structure of construction of the code.

Early iterative decoding algorithms were designed for binary codes and apply to binary LDPC codes. They are the 'sum-product' algorithm (also known as 'belief propagation' or 'message passing' algorithm) and the 'min-sum' algorithm disclosed both in "N. Wibereg, H-A. Loeliger, and R. Kotter, Codes and Iterative Decoding on General Graphs, European Transactions on Telecommunications and Related Technologies, special issue on Turbo Coding, June 1995". They provide near-optimal performance in terms of error decoding probability.

Iterative decoding algorithms designed for non-binary codes were inspired by the 'sum-product' algorithm. Exemplary iterative decoders for non-binary codes comprise the 'q-ary sum-product' algorithm disclosed for example in:

"M. Davey and D. MacKay, Low-density parity check codes over GF(q), IEEE Communications Letters, vol. 2, no. 6, pages 165-167, June 1998", "D. J. C. Mackay and M. Davey, Evaluation of Gallager Codes for Short Block Length and High Rate Applications, In Proceedings of IMA Workshop on Codes, Systems and Graphical Models, 1999", and "L. Barnault and D. Declercq, Fast decoding algorithm for LDPC over GF(q), In Proceedings of IEEE Information Theory Workshop, pages 70-73, April 2003".

Some iterative decoding algorithms are based on logarithmic-scale computations for reducing the computational complexity by transforming product operations to simple summation operations. Such decoding schemes comprise:

the 'max-log-map' turbo codes decoder disclosed in "H. Sadjadpour, Maximum A Posteriori Decoding Algorithms For Turbo Codes, In Proceedings of SPIE, vol. 4045, 2000", the 'extended min-sum' (EMS) non-binary LDPC codes decoder disclosed in "D. Declercq and M. Fossorier, Decoding algorithms for non-binary LDPC codes over GF, IEEE Transactions on Communications, vol, 55, no. 4, pages 633-643, April 2007";

the 'min-max' non-binary LDPC codes decoder disclosed in "V. Savin, Min-max decoding for non-binary LDPC codes, In Proceedings of IEEE International Symposium on Information Theory, pages 960-964, July 2008", and the 'Trellis EMS decoder' disclosed for examples in "J. O. Lacruz, F. Garcia-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, January 2015" and "E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, C A, 2013, pp. 831-835".

The EMS algorithm is based on log-domain computations of the exchanged messages between the variable node processing units and the check node processing units. As the largest complexity of the EMS algorithm is the computation performed by the check node processing units, the EMS algorithm applies a sorting and truncation of processed messages to further alleviate the computational complexity and memory requirements at check node processing units. Message sorting is performed according to an order of the reliability metrics associated with the symbols comprised in the received messages. Message truncation is performed for retaining the most reliable symbols in a given input and/or output message.

The computation of check node messages at the level of the check node processing units from the sorted and truncated input messages (i.e. variable node messages) can be performed according to various architectures. Existing architectures include "forward-backward" architectures and syndrome-based architectures.

In a "forward-backward" architecture, the computations performed by a check node processing unit are divided up into multiple serial calculations involving multiple elementary check node processing units (hereinafter referred to as 'elementary check node processors'). Each elementary check node processor processes two or more input messages to generate an intermediate message that is subsequently used by remaining elementary check node processors, at later stages. Computed intermediate messages are sorted based on the reliability metrics associated with the decoded symbols. In addition, an elimination of redundancies is performed by each elementary check node processor to suppress messages comprising the same symbols while keeping the message comprising the most reliable of the redundant symbols. Exemplary algorithms for elementary check node processing comprise:

the 'Bubble check' algorithm disclosed in "E. Boutillon and L. Conde-Canencia, Bubble check: a simplified algorithm for elementary check node processing in extended min-sum non-binary LDPC decoders, Electronics Letters, vol. 46, no. 9, pp. 633-634, April 2010", and an improved version of the 'Bubble check' algorithm known as 'L-Bubble check' disclosed "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013".

The Bubble-check and L-Bubble check algorithms are based on a reduction of the search space of the best intermediate results computed by an elementary check node processor from two input messages.

In a syndrome-based architecture, a check node processing unit implements a syndrome-based decoding. The computation of check node messages from the sorted and truncated input messages requires two steps. At a first step, the check node processing unit computes a set of values termed 'syndromes' involving all input messages. In a second step, a decorrelation operation is performed in association with each check node message. The decorrelation operation consists of cancelling, from the computed syndromes, the contribution of the input message previously received from the variable node processing unit that is a recipient of the computed check node message. The syndrome-based architecture is disclosed in:

"P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015";

"P. Schlafer, et al., A new Architecture for High Speed, Low Latency NB-LDPC Check Node Processing, In Proceedings of IEEE International Symposium on Personal, Indoor and Mobile Radio Communications, August 2015"; and "V. Rybalkin, P. Schlafer and N. Wehn, A New Architecture for High Speed, Low Latency NB-LDPC Check Node Processing for GF(256), In Proceedings of IEEE 83rd Vehicular Technology Conference (VTC Spring), Nanjing, pages 1-5, 2016".

A syndrome-based architecture allows parallel computation, which is particularly advantageous for higher-order Galois fields. However, with such an architecture, the computational complexity is dominated by the number of computed syndromes which increases as the number of the input messages increases.

The forward-backward architecture allows a reduction of the hardware cost. However, it introduces high latency resulting in degradation in the system throughput. The syndrome-based architecture introduces high complexity mainly due to the increasing number of computed syndromes. The implementations of the syndrome-based architecture in practical decoding systems require significant computational and storage resources that are not always available. In particular, some practical implementations of this architecture are not adapted to the decoding of non-binary codes having high coding rates.

There is accordingly a need for developing more efficient and lower complexity architectures for check node processing units implemented in an EMS decoder in particular, and in any Tanner graph-based iterative decoder in general.

SUMMARY

In order to address these and other problems, there is provided a decoder for determining an estimate of an encoded signal. The decoder comprises one or more variable node processing units and one or more check node processing units configured to exchange messages. Each message comprises one or more components. A component comprises a symbol and a reliability metric associated with the symbol. The decoder comprises:

at least one vector permutation unit configured to receive a set of at least three variable node messages comprising variable node components from at least one variable node processing unit and to generate permuted messages depending on a plurality of the reliability metrics comprised in the variable node components. The variable node messages are sorted according to an order of the reliability metrics; and at least one check node processing unit configured to:

calculate at two or more elementary check node processors a set of syndromes from the at least three permuted messages, generate at least one check node message from the determined set of syndromes, and send the generated at least one check node message to a signal estimation unit.

According to some embodiments, the permuted messages may be determined by applying one or more vector permutations to the set of at least three variable node messages. In such embodiments, a permutation index may be associated with each vector permutation, the at least one vector permutation unit being configured to extract components of the at least three variable node messages according to the permutation index. The vector permutation may be applied to permute the at least three variable node messages according to a given order of the reliability metrics of the extracted components.

In some embodiments, the number of the vector permutations may be predefined.

In some embodiments, the at least one variable node processing unit may be configured to exchange at least three messages with said at least one check node processing unit during a number of iterations. The signal may be encoded using at least one error correcting code. In such embodiments, the number of the vector permutations may be determined depending on at least one parameter chosen in a group consisting of a signal-to-noise ratio, a number of components comprised in the variable node messages, the at least one error correcting code, and the number of iterations.

In some embodiments, the permutation index associated with a vector permutation may depend on the number of the variable node messages and/or on the reliability metrics comprised in a plurality of the components of the variable node messages and/or on the at least one error correcting code.

According to some embodiments, a syndrome may comprise a symbol, a reliability metric associated with the symbol, and a binary vector. Each elementary check node processor may be configured to determine an intermediate message from a first message and a second message, the first message and second message being derived from the at least three permuted messages. An intermediate message may comprise one or more sorted intermediate components and an intermediate binary vector associated with each intermediate component, each intermediate component comprising a symbol and a reliability metric associated with the symbol. The one or more intermediate components may be sorted according to an order of the reliability metrics associated with the symbols, the two or more elementary check node processors may be configured to calculate the set of syndromes from the intermediate message determined from all of the at least three permuted messages.

In some embodiments, at least one elementary check node processor may be configured to determine the symbol comprised in an intermediate component by applying an addition operation over an algebraic structure of construction of the at least one error correcting code, the addition operation being applied to the symbol comprised in a component of the first message and to the symbol comprised in a component of the second message.

In some embodiments, at least one elementary check node processor may be configured to determine the reliability metric associated with a symbol comprised in an intermediate component by applying an addition operation over a given algebraic structure, the addition operation being applied to the reliability metric associated with a symbol comprised in a component of the first message and to the reliability metric associated with a symbol comprised in a component of the second message. In some embodiments, the given algebraic structure may be chosen in a group consisting of the field of real numbers, the field of integer numbers, and the field of natural numbers.

In some embodiments, each component comprised in the at least three permuted messages may be associated with an initial binary value. Each component of the first message and the second message may be associated with a binary vector derived from the initial binary values. At least one elementary check node processor may be configured to determine the intermediate binary vector associated with each intermediate component of the intermediate message by applying a vector concatenation operation, the vector concatenation operation being applied to the binary vector associated with a component of the first message and to the binary vector associated with a component of the second message.

According to some embodiments, the initial binary value may depend on the reliability metrics associated with the symbols. In particular, for each permuted message, the component of the permuted message comprising the most reliable symbol may be associated with an initial binary value equal to a predefined first value and the remaining components of the permuted message may be associated with an initial binary value equal to a predefined second value.

In one embodiment, the predefined first value may be equal to zero and the predefined second value may be equal to one.

In another embodiment, the predefined first value may be equal to one and the predefined second value may be equal to zero.

In some embodiments, the at least one check node processing unit may comprise at least one elementary check node processor configured to determine an intermediate message from a first message comprising two or more components and a second message comprising one component, the intermediate message comprising at least two intermediate components.

In some embodiments, the at least one check node processing unit may comprise at least one elementary check node processor configured to determine an intermediate message from a first message comprising two components and a second message comprising two or more components, the determined intermediate message comprising at least three intermediate components.

Further, according to some embodiments, the at least one check node processing unit may comprise at least one elementary check node processor configured to determine an intermediate message comprising one intermediate component, the one intermediate component being determined from the most reliable component comprised in a first message and the most reliable component comprised in a second message.

According to some embodiments, the at least one check node processing unit may be configured to determine the check node components comprised in a check node message associated with at least one variable node processing unit by:
  determining, from the set of syndromes, a set of candidate check node components depending on the binary vectors comprised in the set of syndromes. The candidate check node components may comprise one or more components. Each component may comprise a symbol and a reliability metric associated with the symbol, and selecting a predefined number of components from the determined set of candidate check node components depending on the reliability metrics associated with the symbols, which provides the check node components of the check node message associated with at least one variable node processing unit.

In some embodiments, the candidate check node components may comprise two or more components comprising a same symbol.

In some embodiments, the check node components may comprise distinct symbols.

According to some embodiments, the decoder may comprise a vector permutation unit in association with each check node processing unit.

In other embodiments, the decoder may comprise two or more check node processing units and one vector permutation unit in association with a plurality of the two or more check node processing units.

According to one embodiment, the elementary check node processors may be implemented in a serial architecture.

In other embodiments, the elementary check node processors may be implemented in a tree architecture.

Further, in other embodiments, the elementary check node processors may be implemented in a hybrid architecture comprising one or more elementary check node processors implemented in a serial architecture and one or more elementary check node processors implemented in a tree architecture.

In some embodiments, the at least one error correcting code may be a non-binary error correcting code.

There is also provided a decoding method for determining an estimate of an encoded signal. The decoding may comprise exchanging of messages between one or more variable node processing units and one or more check node processing units. Each message may comprise one or more components. A component may comprise a symbol and a reliability metric associated with the symbol. The method may comprise:
  receiving a set of at least three variable node messages comprising variable node components and generating permuted messages depending on a plurality of the reliability metrics comprised in the variable node components, the variable node messages being sorted according to an order of the reliability metrics;
  calculating a set of syndromes from the at least three permuted messages,
  generating at least one check node message from the determined set of syndromes, and
  determining an estimate of the encoded signal from at least one check node message.

Advantageously, the various embodiments allow a reduction of the number of computed syndromes involved in the computation of check node messages at check node processing units. The computational complexity at check node processing units can be therefore reduced.

Moreover, the presorting of the input messages prior to the processing at the level of the elementary check node processors allows significant simplifications of the elementary check node processors in terms of the number of components needed to compute the syndromes. Such simplifications allow reducing further the computational and hardware implementation costs of the check node processing unit.

Also, the various embodiments provide a low-complexity and low-latency architecture for check node processing taking advantage of the parallelism of the syndrome-based decoding and the linear complexity of elementary check node processing. The combination of syndrome decoding with elementary check node processing allows a reduction in the costs of the hardware implementation of the check node processing units.

Further advantages of the present invention will become clear to the skilled person upon examination of the drawings and the detailed description.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below.

FIG. 11 is a table illustrating the complexity in terms of the number of slices in a FPGA implementation and latency (in number of cycles) of elementary check node processors, according to some embodiments; and FIG. 12 is a table illustrating the complexity in terms of the number of occupied slices in a FPGA implementation and latency (in number of cycles) of check node processing units, according to some embodiments.

DETAILED DESCRIPTION

Embodiments of the present invention provide, alone or in combination, devices, methods, and computer program products for decoding a signal encoded using at least one error correcting code with a reduced computational complexity. In particular, embodiments provide devices, methods and computer program products for efficient architectures for check node processing units implemented in iterative decoding algorithms used to decode a signal encoded using at least one non-binary error correcting code.

Methods, devices and computer program products according to the various embodiments may be implemented in several types of digital data transmission and storage devices and systems used in various types of applications. Exemplary devices and systems comprise computers, disks, laptops, phones, smartphones, recorders, base stations, drones, satellites, etc. Exemplary applications comprise magnetic and optical recording, digital television and video broadcasting, digital communications, etc.

The following description of some embodiments of the invention will be made with reference to digital communication systems, for illustration purpose only. However, the skilled person will readily understand that the various embodiments of the invention may be integrated in other types of systems used for other applications such as positioning systems and spacecraft systems.

Figure 1:
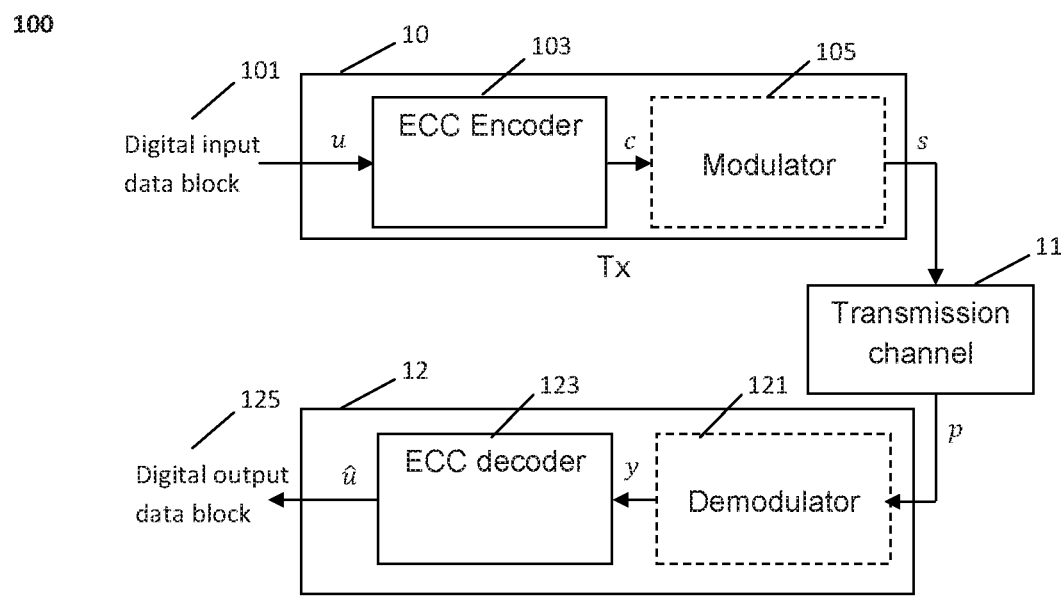
FIG. 1 is a block diagram of an exemplary application of the invention to communication systems, according to some embodiments.

Referring to FIG. 1, there is illustrated an exemplary application of the invention in a digital communication system 100. The communication system 100 may be for example:
  wired (e.g. optical fiber-based or T-Line);
  wireless (e.g. radio or Visible Light communication systems);
  acoustic (e.g. underwater acoustic communication systems);
  molecular (used for example in underground structures e.g. tunnels and pipelines or in underwater environments).

The communication system 100 may comprise at least a transmitter device 10 and a receiver device 12. The transmitter device 10 (also referred to hereinafter as a "transmitter") is configured to communicate data information to the receiver device 12 (also referred to hereinafter as "receiver") via the transmission channel 11.

In an application of the invention to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the invention to wireless communication systems such as ad-hoc wireless networks, wireless sensor networks and radio communication systems, the transmitter 10 and receiver 12 may be any type of fixed or mobile wireless device configured to operate in a wireless environment. Exemplary devices in such applications comprise laptops, mobile phones and base stations. The transmission channel 11 may be in this case any wireless propagation medium. Further, the transmission channel 11 may accommodate several transmitters 10 and receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the invention to optical communication systems such as optical fiber-based systems, the transmitter 10 and receiver 12 may be any optical transceiver device configured to respectively transmit and receive data information propagated over an optical link. Exemplary optical communication systems comprise Polarization Division Multiplexing (PMD) and Mode Division Multiplexed (MDM) systems.

For any type of wired, wireless or optical communication systems, the transmission channel 11 may be any noisy channel. The noise may result from the thermal noise of the system components or the intercepted interfering radiation by antennas. Other exemplary sources of noise comprise switching, manual interruptions, electrical sparks and lightning. In some embodiments, the total noise may be modeled by an additive white Gaussian noise (AWGN).

Further, according to some embodiments in application to digital mass storage, the transmission channel 11 may be modeled for example by an erasure channel, a binary symmetric channel, or a Gaussian channel. In such embodiments, the transmission channel 11 may be any type of storage device which can be sent to (written on) and received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (Orthogonal Frequency Division Multiplexing) and FBMC (Filter Bank Multi-Carrier).

According to some embodiments of the invention, the transmitter 10 may comprise an error correcting code (ECC) encoder 103, configured to encode a digital input data block 101 denoted by u using a linear block error correcting code into a codeword c. The receiver 12 may be configured to receive a noisy copy p of the encoded data, or codeword, through the transmission channel 11. The receiver 12 may comprise an error correcting code decoder 123 configured to deliver a digital output data block 125 as an estimate û of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signals and to map it onto the transmission channel 11.

The receiver 12 may comprise homologous processing means configured to perform the reverse functions. It may comprise a demodulator 121 configured to generate a signal y by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoding algorithm involving a number of check node processing units according to the various embodiments of the invention.

Further, the following description of some embodiments of the invention will be made with reference to linear block error correcting codes, for illustration purpose only. However, the skilled person will readily understand that the various embodiments of the invention apply to any linear codes comprising the convolutional codes and in general to any error correcting codes.

Accordingly, the ECC encoder 103 may implement a linear block error correcting code designated by $C(n,k)$; n and k referring respectively to the length of codewords and the length of the encoded data block. The ECC encoder 103 encodes accordingly a message vector u of length k into a codeword c, c being a vector of length n. The codeword c therefore comprises n elements, also referred to as "symbols". Among the n symbols, n–k symbols correspond to redundancy symbols, also called 'parity symbols'. The function of the extra parity symbols is to allow the receiver 12 to detect and possibly correct any error that occurred during the transmission.

A linear code $C(n,k)$ may be represented in a matrix form using a generator matrix denoted by G and a parity-check matrix denoted by H. Using a row notation of vectors, the generator matrix G is of dimensions k×n while the parity-check matrix has dimensions of (n–k)×n. The two matrices are linked by the relation G. $H^t$=0. In addition, entries of both matrices belong to the algebraic structure over which the error correcting code is constructed. Using the matrix representation, any codeword c satisfies the equation c. $H^t$=0. This equation is also called "parity-check equation". It defines n parity-check constraints designed to be satisfied by any codeword.

In association with the matrix representation, the linear code $C(n,k)$ may be represented using a bipartite graph $\mathcal{H}$ termed "Tanner graph". This graph comprises n variable nodes and n–k check nodes.

Each variable node vn∈{1, 2, . . . , n} is associated with a column of the parity-check matrix. Each check node cn∈{1, 2, . . . , n–k} is associated with a row of the parity-check matrix, i.e. with a parity-check equation. A variable node vn is connected to a check node cn if the entry $H_{vn,cn}$ of the parity-check matrix is not equal to zero, i.e. if $H_{vn,cn}$≠0.

$\mathcal{H}_v$(vn) denotes the set of the check nodes connected to the variable node in. Similarly, $\mathcal{H}_c$(cn) denotes the set of the variable nodes connected to the check node cn.

The degree of a variable node in (equivalently a check node cn) corresponds to the cardinality of the set $\mathcal{H}_v$(vn) (equivalently the cardinality of the set $\mathcal{H}_c$(cn)).

According to some embodiments, the algebraic structure of construction of the error correcting code may be any non-zero commutative division ring, also called a "field". Exemplary fields comprise the field of real numbers, the field of complex numbers, the field of rational numbers, and finite fields (also known as 'Galois fields').

The following description of some embodiments will be made with reference to finite fields, for illustration purpose only. However the skilled person will readily understand that the invention may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings," 2016 23rd International Conference on Telecommunications (ICT), Thessaloniki, 2016, pp. 1-7".

For linear codes constructed over Galois Fields, generally denoted by GF(q), where q≥2 designates the cardinality of the code, the symbols take values in GF(q). A codeword c is thus a vector of n symbols that belong each to GF(q). The code is binary if the symbols belong to GF(2). In contrast, when q>2, the code is qualified as non-binary.

The following description of some embodiments will be made with reference to an ECC encoder 103 encoding data using a non-binary LDPC code, for illustration purpose only. However, the skilled person will readily understand that the various embodiments of the invention also apply to other non-binary codes and in general to binary and non-binary linear block error correcting codes and non-binary turbo codes. Non-binary error correcting codes can advantageously be used for high spectral efficiency coding.

For the purpose of example, the ECC decoder 123 implements a non-binary LDPC code decoder for decoding the data encoded by the ECC encoder 103 using a non-binary LDPC code. The ECC decoder 123 may implement any iterative non-binary LDPC code decoder such as the Extended Min Sum algorithm or the min-max algorithm.

According to a particular application to the EMS algorithm, the various embodiments of the invention provide efficient, low-latency, and low-complexity implementations of check node processing units involved in the iterative decoding process using an EMS algorithm. The description of the invention is made with reference to the EMS algorithm. However, the skilled person will readily understand that the various embodiments apply to any iterative non-binary LDPC codes decoder such as the min-max decoding algorithm.

Figure 2:
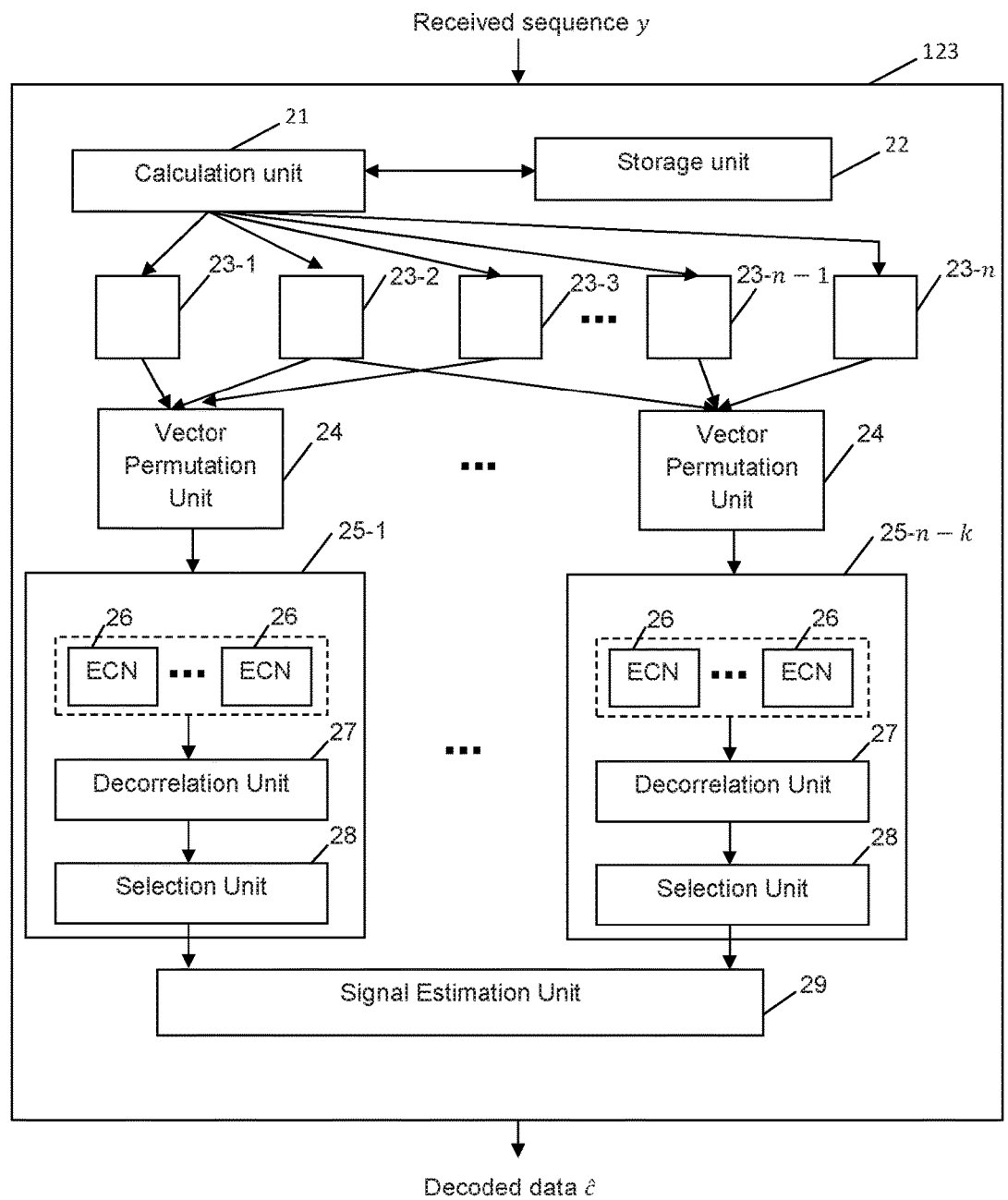
FIG. 2 is a block diagram of a decoder, according to an embodiment in which a vector permutation unit is associated with each check node processing unit.

Referring to FIG. 2, there is illustrated a structure of an iterative non-binary LDPC decoder 123 according to some embodiments using the EMS algorithm.

The iterative decoder 123 may be configured to determine an estimate ĉ of the transmitted codeword c by the transmitter 10 from a received noisy sequence y. It may process a signal over several iterations bringing it, at each iteration, closer to the transmitted codeword c.

The iterative decoder 123 may be configured to determine the estimate ĉ based on the Tanner graph representation of the code $C(n,k)$ used at the transmitter 10. Accordingly, the iterative decoder 123 may comprise n variable node processing units 23-1 to 23-$n$ and $n$–k check node processing units 25-1 to 25-($n$–k).

Each variable node processing unit 23-$vn$ maps to one variable node in the Tanner graph. Each check node processing unit 25-$cn$ maps to one check node in the Tanner graph. The variable node processing units 23-$vn$ for vn=1, . . . , n and check node processing units 25-$cn$ for cn=1, . . . , n may be configured to iteratively exchange messages to estimate the most reliable codeword ĉ from the noisy sequence y.

In the following, the messages delivered by the variable node processing units will be referred to as 'variable node messages' and the messages delivered from the check node processing units are referred to as 'check node messages'.

A variable node processing unit 23-$vn$ corresponding to a variable node in may be configured to receive check node messages from the check node processing units 25-$cn$ corresponding to the set $\mathcal{H}_v$(vn). A variable node processing unit 23-vn may be further configured to process these check node messages and deliver variable node messages to at least one check node processing unit 25-cn corresponding to the check nodes in the set $\mathcal{H}_v(vn)$.

Similarly, a check node processing unit 25-cn corresponding to a check node cn may be configured to process variable node messages sent by the variable node processing units 23-vn corresponding to the set $\mathcal{H}_c(en)$. A check node processing unit 25-cn may be further configured to deliver check node messages to at least one variable node processing unit 23-vn corresponding to the variable nodes in the set $\mathcal{H}_c(en)$.

The processing performed by the various variable node processing units 23-vn and check node processing units 25-cn may be implemented according to several scheduling mechanisms.

According to a first implementation, all the variable node processing units 23-vn for vn=1, ..., n, may be configured to operate in a first round and then all the check node processing units 25-cn, for cn=1, ..., n−k, may be configured to update the messages to be sent to the variable node processing units in their corresponding sets $\mathcal{H}_c(en)$. This specific scheduling is known as "flooding scheduling". In particular, the check node processing units 25-cn may be configured to operate serially or in parallel where from 2 to n−k check node processing units 25-cn may operate at the same time.

According to a second implementation based on a "horizontal scheduling", the check node processing units 25-cn, for cn=1, ..., n−k, may be configured to operate serially, updating all variable node processing units 23-vn which are connected to them. In particular, a group of check node processing units 25-cn may be configured to operate in parallel, updating all connected variable node processing units 23-vn provided that there is no variable node processing unit 23-vn in conflict (e.g. when two check node processing units 25-cn are connected to the same variable node processing unit 23-vn).

According to a third implementation based on a "vertical scheduling", the variable node processing units 23-vn may be configured to operate serially, updating all check node processing units 25-cn which are connected to them.

The exchange of messages may be initialized by the variable node processing units 23-vn. It may terminate either if the processed signal satisfies the parity-check equation or if a maximum number of iterations is reached without meeting all parity-check constraints.

Accordingly, the iterative decoder 123 may comprise a signal estimation unit 29 configured to receive, at each iteration of the decoding process, the check node messages delivered by the check node processing units 25-cn, and:
- deliver the processed signal as an estimate of the original codeword if the processed signal satisfies the parity-check equation; or
- declare a decoding failure but nevertheless output the codeword estimated at the last iteration if a maximum number of iterations is reached without meeting all parity-check constraints.

As illustrated in FIG. 2, the iterative decoder 123 may further comprise a storage unit 22 configured to store the received sequence y. It may also comprise a calculation unit 21 configured to determine initial values of variable node messages to be delivered by the variable node processing units 23-vn based on the received sequence y loaded from the storage unit 22.

The exchanged messages between the variable node processing units 23-vn and the check node processing units 25-cn may carry representative information on the symbols According to some embodiments, the length of an exchanged message may be equal to the order of the Galois field used to construct the linear code. Accordingly, each exchanged message may be a vector of length q for codes constructed over GF(q).

In other embodiments related to soft-decision decoding, exchanged messages may carry the values of the symbols and metrics measuring their reliabilities (also referred to hereinafter as 'reliability metrics'). The value of the reliability metric is related to the reliability of the symbol. In such embodiments, each exchanged message may be a vector comprising q components, a component comprising a value of a symbol in GF(q) and its reliability metric.

In some embodiments, the reliability metric of a symbol may correspond to an estimated probability density function of the symbol which represents the probability that the symbol is correct. In particular, the reliability metric may be represented in the log-domain by a logarithmic likelihood ratio (LLR) value.

The computational complexity of the iterative decoding process is dominated by the computations performed by the check node processing units 25-cn. In one embodiment using the EMS algorithm for decoding non-binary LDPC codes, the computational complexity of the processing performed by the check node processing units 25-cn may be reduced without sacrificing the decoding error performance.

In order to reduce the computation complexity involved during the processing at the check node processing units 25-cn, there are provided presorting techniques and implementation architectures of check node processing units based on elementary computations performed by a plurality of elementary check node processors.

The aim of the presorting techniques is to polarize the statistics of the variable node messages that will be processed by the check node processing units 25-cn by sorting the variable node messages depending on the reliability metrics associated with the symbols comprised in the variable node components of said variable node messages. The presorting techniques may advantageously reduce the number of the components needed to compute the check node messages, enabling a reduction of the computational complexity at the check node processing units.

According to some embodiments, the presorting techniques may be implemented within the check node processing units 25-cn.

In other embodiments, the presorting techniques may be implemented within vector permutation units that are not implemented within the check node processing units 25-cn. Accordingly, the decoder 123 may comprise at least one vector permutation unit 24 configured to receive a set of variable node messages from the variable node processing units 23-vn and to generate permuted messages to be delivered to each check node processing unit 25-cn to which are destined the variable node messages originating from the variable node processing units 23-vn for vn varying between 1 and n.

In some embodiments (depicted in FIG. 2), the decoder 123 may comprise a vector permutation unit 24 in association with each check node processing unit 25-cn. For example, this configuration may correspond to embodiments in which the check node processing units 25-cn operate in parallel.

Figure 3:
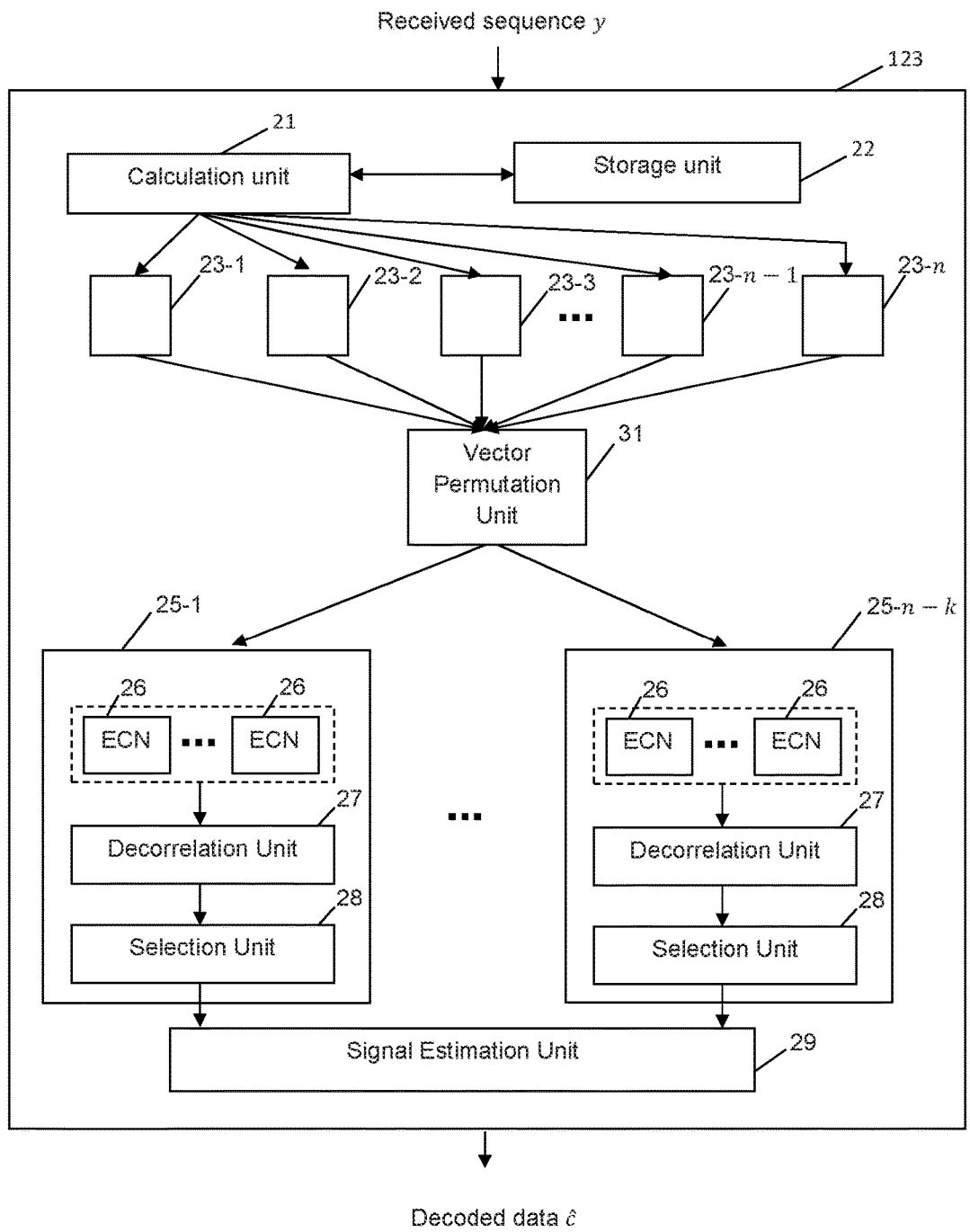
FIG. 3 is a block diagram of a decoder, according to an embodiment in which a vector permutation unit is associated with a plurality of check node processing units.

In other embodiments depicted in FIG. 3, the decoder 123 may comprise a vector permutation unit 31 in association with a plurality of the check node processing units 25-*cn*. For example, this configuration may correspond to embodiments in which at least some of the check node processing units 25-*cn* operate in parallel and some of them operate serially.

The following description of some embodiments will be made with reference to a vector permutation unit 24 in association with each check node processing unit 25-*cn*, for illustration purpose only. Further, in order to facilitate the understanding of the following description of some embodiments, a notation at the level of a check node processing unit 25-*cn* will be used in the following, with cn taking value between 1 and n−k. The degree of the check node processing unit 25-*cn* is denoted by $d_{cn}$, i.e. the corresponding check node in the Tanner graph $\mathcal{H}$ is connected to $d_{cn}$ variable nodes which constitute the set $\mathcal{H}_c(cn)$. Advantageously, the degree of the check node processing unit 25-*cn* may satisfy $d_{cn} \geq 3$.

The variable node messages sent by the variable node processing units associated with the nodes in the set $\mathcal{H}_c(cn)$ are denoted by $U_1, U_2, \ldots, U_{d_{cn}}$. The check node messages generated by the check node processing unit 25-*cn* to the variable node processing units 23-*vn* in the set $\mathcal{H}_c(cn)$ are denoted by $V_1, V_2, \ldots, V_{d_{cn}}$.

A check node equation of degree $d_{cn}$ in GF(q) may be defined, in association with the check node processing unit 25-*cn*, by:

$$e_1 \oplus e_2 \oplus \ldots \oplus e_{d_{cn}} = 0 \quad (1)$$

In equation (1), the vectors $e_i$, for $i=1, \ldots, d_{cn}$, designate variables and the operator $\oplus$ designates the addition operator in the Galois field.

According to some embodiments using the EMS algorithm, the messages delivered from the variable node processing units 23-*vn* may be sorted and truncated so as to keep only the $n_{m,in}$ most reliable components, with being strictly lower than q ($n_{m,in} \ll q$). The sorting may be performed in a given order (for example by increasing or decreasing order) of the reliability metrics associated with the symbols. Further, the sorting and truncation operations may be performed by the variable node processing units 23-*vn* or by the vector permutation units 24.

The following description will be made with reference to some embodiments using soft-output decoding based on sorting and truncation of the variable node messages sent by the variable node processing units 23-*vn*, for illustration purpose only. In such embodiments, each variable node message $U_i$ is a vector comprising $n_{m,in}$ variable node components of a one-column vector representation given by:

$$U_i = \begin{pmatrix} U_i[n_{m,in}-1] \\ \vdots \\ U_i[1] \\ U_i[0] \end{pmatrix} \quad (2)$$

A variable node component $U_i[j] = (U_i^\oplus[j], U_i^+[j])$ for $j=0, \ldots, n_{m,in}-1$ comprises a symbol denoted by $U_i^\oplus[j]$ and the reliability metric associated with this symbol denoted by $U_i^+[j]$. The components of each variable node message may be sorted such that the component comprising the most reliable symbol corresponds to the component $U_i[0]$, for $i=1, \ldots, d_{cn}$ and that $U_i^+[j+1] \geq U_i^+[j]$ for $j=0, \ldots, n_{m,in}-2$.

In embodiments in which the presorting techniques are performed by vector permutation units 24, the vector permutation unit 24 associated with the check node processing unit 25-*cn* may be configured to receive a set of at least three variable node messages denoted by $UIN = (U_1, U_2, \ldots, U_{d_{cn}})$ comprising the variable node messages $U_1, U_2, \ldots, U_{d_{cn}}$ sent by the variable node processing units corresponding to the set $\mathcal{H}_c(cn)$. Using the one-column vector notation of the variable node messages, the set UIN may be written as:

$$UIN = \left( \begin{pmatrix} U_1[n_{m,in}-1] \\ \vdots \\ U_1[1] \\ U_1[0] \end{pmatrix}, \begin{pmatrix} U_2[n_{m,in}-1] \\ \vdots \\ U_2[1] \\ U_2[0] \end{pmatrix}, \ldots, \begin{pmatrix} U_{d_{cn}}[n_{m,in}-1] \\ \vdots \\ U_{d_{cn}}[1] \\ U_{d_{cn}}[0] \end{pmatrix} \right) \quad (3)$$

The vector permutation unit 24 may be configured to determine permuted messages denoted by $UP_1, UP_2, \ldots, UP_{d_{cn}}$ by applying one or more vector permutations to the set of variable node messages $UIN = (U_1, U_2, \ldots, U_{d_{cn}})$ depending on the reliability metrics $U_i^+[j]$ associated with the symbols $U_i^\oplus[j]$ comprised in the variable node messages. A vector permutation is denoted by $\pi_t$ for $t=1, \ldots$, Tmax, with Tmax designating the number of the one or more vector permutations.

According to some embodiments, the vector permutation unit 24 may be configured to determine a permutation index, denoted by $j_t$, in association with each vector permutation $\pi_t$, the permutation index taking value between 1 and $n_{m,in}$.

Given the permutation index $j_t$, a vector permutation $\pi_t$ may be applied to permute two or more of the variable node messages in the set $UIN = (U_1, U_2, \ldots, U_{d_{cn}})$ according to the reliability metrics of the components $U_i[j_t]$ corresponding to the $j_t^{th}$ most reliable components in the variable node messages $U_i$.

The permuted set comprising the permuted messages $UP_1^t, UP_2^t, \ldots, UP_{d_{cn}}^t$ resulting from a vector permutation $\pi_t$ may be represented in the form:

$$UP^t = (UP_1^t, UP_2^t, \ldots, UP_{d_{cn}}^t) = (U_{\pi_t(1)}, U_{\pi_t(2)}, \ldots, U_{\pi_t(d_{cn})}) \quad (4)$$

The vector permutation 24 may be configured to determine the permuted messages corresponding to a vector permutation $\pi_t$ by performing four steps as follows:

1) Extract, from the set of variable node messages UIN, the vector $P^t$ corresponding to the components $U_i[j_t]$ such that:

$$P^t = (U_1[j_t], U_2[j_t], \ldots, U_{d_{cn}}[j_t]) \quad (5)$$

Using the vector notation of the variable node messages, the components comprised in the extracted vector $P^t$ (as indicated by the row pointed to by $P^t$ in equation (6) below) correspond to the components of the variable node such that:

$$UIN = \left( \begin{pmatrix} U_1[n_{m,in}-1] \\ \vdots \\ U_1[j_t] \\ \vdots \\ U_1[0] \end{pmatrix}, \begin{pmatrix} U_2[n_{m,in}-1] \\ \vdots \\ U_2[j_t] \\ \vdots \\ U_2[0] \end{pmatrix}, \ldots, \begin{pmatrix} U_{d_{cn}}[n_{m,in}-1] \\ \vdots \\ U_{d_{cn}}[j_t] \\ \vdots \\ U_{d_{cn}}[0] \end{pmatrix} \right) \leftarrow P^t \quad (6)$$

2) Determine a vector $SP^t$ by sorting the vector $P^t$ in a given order of the reliability metrics $U_i^+[j_t]$ comprised in the components $U_i[j_t]$ for $i=1, \ldots, d_{cn}$. The sorting may be performed in an increasing or decreasing order of the reliability metrics.

3) Determine, from the generated vector $SP^t$, the permutation $\pi_t$ associated with the sorting of the vector $P^t$ such that the sorted vector $SP^t$ can be expressed as:

$$SP^t = \pi_t(P^t)(U_{\pi_t(1)}[j_t], U_{\pi_t(2)}[j_t], \ldots, U_{\pi_t(d_{cn})}[j_t]) \quad (7)$$

4) Apply the permutation $\pi_t$ to the set of variable node messages to obtain the set $UP^t$ according to equation (4).

According to some embodiments, the number Tmax of the one or more vector permutations $\pi_t$ may be predefined.

According to other embodiments, the number Tmax of the one or more vector permutations $\pi_t$ may be determined depending on at least one parameter chosen in a group consisting of a signal-to-noise ratio, the number $n_{m,in}$ of components comprised in the variable node messages $U_{i,i=1,\ldots,d_{cn}}$, the error correcting code $\mathcal{C}$ (n,k) (e.g. the algebraic structure of construction of the code), and the number of iterations of the iterative decoding process.

Further, in some embodiments, the vector permutation unit 24 may be configured to determine a permutation index $j_t$ depending on the number of variable node messages, i.e. on the degree of the check node processing unit 25-$cn$, and/or on the reliability metrics comprised in some of the components of the variable node messages and/or on the algebraic structure of construction of the error correcting code $\mathcal{C}$ (n,k).

For example, in one embodiment, the number Tmax of the vector permutations may be equal to one, i.e. Tmax=1 corresponding to a single permutation $\pi_1$.

In such embodiments, the permutation index may be advantageously equal to 1, i.e. $j_1=1$. Accordingly, the variable node vectors may be permuted in a way that the components $U_1[1], U_2[1], \ldots, U_{d_{cn}}[1]$ are sorted in a given order of the reliability metrics $U_i^+[1]$ for $i=1, \ldots, d_{cn}$.

The determined permuted messages $UP_1, UP_2, \ldots, UP_{d_{cn}}$ are then sent to the check node processing unit 25-$cn$ configured to receive the variable node messages from the variable node processing units associated with the variable nodes in the set $\mathcal{H}_c(cn)$. The check node processing unit 25-$cn$ may be configured to generate, from the permuted messages $UP_1, UP_2, \ldots, UP_{d_{cn}}$, at least equal to three, a check node message $V_i$ in association with each variable node processing unit 23-$vn$ associated with the variable nodes in the set $\mathcal{H}_c(cn)$ such that the check node message $V_{\pi(i)}$ is associated with the permuted message $UP_i$ for $i=1, \ldots, d_{cn}$.

In some embodiments, the check node messages generated by the check node processing unit 25-$cn$ may be sorted and truncated such that a check message $V_i$ is a vector comprising $n_{m,out}$ check node components in the form:

$$V_i = \begin{pmatrix} V_i[n_{m,in}-1] \\ \vdots \\ V_i[1] \\ V_i[0] \end{pmatrix} \quad (8)$$

A check node component $V_i[j]=(V_i^{\oplus}[j], V_i^+[j])$ for $j=0, \ldots n_{m,out}-1$ comprises a symbol and the reliability metric associated with said symbol. Similarly to the variable node messages, each check node message may be sorted according to a given order (increasing or decreasing) of the reliability metrics. In particular, the check node components of a check node message may be sorted in a way that the check node component comprising the most reliable symbol corresponds to the component $V_i[0]$, for $i=1, \ldots, d_{cn}$ and that $V_i^+[j+1] \geq V_i^+[j]$ for $j=0, \ldots n_{m,out}-2$.

According to some embodiments, the computations of the check node components comprised in the check node messages may be performed based on elementary computations, enabling a significant complexity reduction.

Accordingly, the check node processing unit 25-$cn$ may comprise two or more elementary check node processors 26 configured to calculate a set of NS syndromes denoted by $S=\{S_1, S_2, \ldots, S_{NS}\}$ from the permuted messages $UP_1, UP_2, \ldots, UP_{d_{cn}}$, the check node components comprised in the check node messages being derived from the set of syndromes.

The use of the elementary check node processors 26 for the computation of the set of syndromes enables reducing the computational complexity of syndrome decoding. Indeed, with the use of elementary check node processors 26, the number of computed syndromes used for determining check node messages is reduced, thereby making it possible to exploit the parallelism of syndrome decoding while alleviating the computational complexity which is generally due to the high number of computed syndromes. In addition, the elementary check node processors 26 provide sorted components (depending on the order of the reliability metrics of the symbols) in the computed intermediate messages. As a result, the sorting operation conventionally applied after syndrome calculation can be removed, thereby enabling a reduction of the computational complexity required for the sorting process as well as a reduction of the implementation costs.

According to some embodiments, the set of syndromes $S=\{S_1, S_2, \ldots, S_{NS}\}$ may be determined from a plurality of intermediate messages computed by the two or more elementary check node processors 26.

More specifically, the check node processing unit 25-$cn$ of degree $d_{cn}$ may comprise $d_{cn}-1$ elementary check node processors 26. Each elementary check node processor 26 may be configured to determine an intermediate message from a first message and a second message, the first and the second messages being derived from the permuted messages $UP_1, UP_2, \ldots, UP_{d_{cn}}$.

An intermediate message denoted by $UP'_t$ may comprise a number $n_t \geq 1$ of sorted intermediate components and an intermediate binary vector associated with each intermediate component, the intermediate components being sorted according to a given order of the reliability metrics of the symbols comprised therein.

In some embodiments, each elementary check node processor 26 may be configured to determine the symbol comprised in an intermediate component of an intermediate message by applying an addition operation over the Galois Field (in general over the structure over which the error correcting code is constructed), said addition operation being applied to the symbol comprised in a component of the first message and to the symbol comprised in a component of the second message.

Moreover, each elementary check node processor 26 may be configured to determine the reliability metric associated with the symbol comprised in an intermediate component of an intermediate message by applying an addition operation over a given algebraic structure to the reliability metric comprised in a component of the first message and the reliability metric comprised in a component of the second message.

According to some embodiments, the algebraic structure may be chosen in a group consisting of the field $\mathbb{R}$ of real numbers, the field $\mathbb{Z}$ of integer numbers, and the field $\mathbb{N}$ of natural numbers.

For example in quantized hardware implementations and software implementations, each elementary check node processor 26 may be configured to determine the reliability metric associated with the symbol comprised in an intermediate component of an intermediate message by applying an addition operation over the integer field $\mathbb{Z}$ or the field of natural numbers $\mathbb{N}$, enabling a complexity reduction.

According to some embodiments, the check node processing unit 25-cn may be further configured to associate an initial binary value with each component $UP_i[j]=(UP_i^{\oplus}[j], UP_i^+[j])$, for $j=0, \ldots, n_{m,in}-1$, of the permuted messages $UP_i$, for $i=1, \ldots, d_{cn}$.

According to some embodiments, the initial value associated with the components $UP_i[j]$ may depend on the reliability metrics $UP_i^+[j]$ associated with the symbols $UP_i^{\oplus}[j]$ comprised in said components. In particular, the check node processing unit 25-cn may be configured to associate an initial binary value equal to a predefined first value with the component comprising the most reliable symbol and to associate an initial binary value equal to a predefined second value with the remaining components.

According to some embodiments, the predefined first value may be equal to zero ('0') and the predefined second value may be equal to one ('1'). In such embodiments, the binary value associated with a component $UP_i[j]$ may be denoted by $UP_i^{DBV}[j]$ and may be given by:

$$UP_i^{DBV}[j] = \begin{cases} 1 & \text{if } j \neq 0 \\ 0 & \text{if } j = 0 \end{cases} \quad (9)$$

Considering sorted permuted messages, conditional equation (9) states that the initial binary value associated with a component comprised in a permuted message is assigned a bit '0' value if the symbol comprised in said component is the most reliable symbol.

According to other embodiments, the predefined first value may be equal to one ('1') and the predefined second value may be equal to one ('0'). Accordingly, the initial binary value associated with a component comprised in a permuted message maybe equal to bit '1' if the symbol comprised in this component is the most reliable symbol, that is, $$UP_i^{DBV}[j] = \begin{cases} 0 & \text{if } j \neq 0 \\ 1 & \text{if } j = 0 \end{cases} \quad (10)$$

Accordingly, each component of the first message and the second message processed by a given elementary check node processor 26 may be associated with a binary vector derived from the initial binary values. In such embodiments, each elementary check node processor 26 may be configured to determine the intermediate binary vector associated with an intermediate component by applying a vector concatenation operation, the vector concatenation operation being applied to the binary vector associated with a component of the first message and to the binary vector associated with a component of the second message.

Among the $d_{cn}-1$ elementary check node processors 26, at least one elementary check node processor 26 may be configured to determine an intermediate message and an intermediate binary vector associated with each component of the intermediate message from two permuted messages, the first and second messages being equal to a first permuted message and a second permuted message, respectively.

Figure 4:
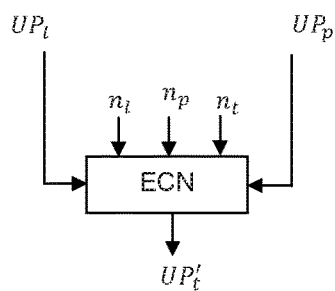
FIG. 4 is a block diagram illustrating the structure of an elementary check node processor, according to some embodiments.

To illustrate the computation of an intermediate message by an elementary check node processor 26, the following description of some embodiments will be made with reference to processing a first and a second message both equal to permuted messages. FIG. 4 shows an elementary check node processor 26 according to such an embodiment. Accordingly, an elementary check node processor 26 may be configured to process a first permuted message $UP_l$ and a second permuted message $UP_p$ for 1 and $p \neq 1$ varying in the set of indices from 1 to $d_{cn}$. From these two permuted messages each comprising $n_{m,in}$ components of a symbol and its reliability metric, an elementary check node processor 26 may be configured to determine an intermediate message denoted by $UP'_t$ comprising a number $n_t$ of intermediate components $UP'_t[j]=(UP'_t^{\oplus}[j], UP'_t^+[j])$ and determine an intermediate binary vector denoted $UP'_t^{DBV}[j]$ in association with each intermediate component $UP'_t[j]$. The intermediate components comprised in an intermediate message may be sorted according to a given order depending on the reliability metrics of the symbols comprised therein such that $UP'_t^+[j+1] \geq UP'_t^+[j]$ for all $j=0, \ldots, n_t-2$.

According to some embodiments, the elementary check node processor 26 may be configured to determine the intermediate message by processing a number $n_l \leq n_{m,in}$ of components from the first message $UP_l$ and/or a number $n_p \leq n_{m,in}$ of components from the second message $UP_p$.

According to some embodiments in which the first message and second message are different from the permuted messages, i.e. correspond to intermediate messages delivered by previous elementary check node processors 26 in the architecture, the number $n_l$ of components processed from the first message and/or the number $n_p$ of components processed from the second message may correspond to the number of components previously delivered by an elementary check node processor 26. In other words, the number of components processed by a given elementary check node processor 26 may depend on the number of components comprised in the previous intermediate messages processed by the elementary check node processors located at previous stages in the architecture.

According to some embodiments, the elementary check node processor 26 may be configured to determine the intermediate message $UP'_t$ according to three steps.

At a first step, the elementary check node processor 26 may be configured to determine a set of auxiliary components from the components of the first message $UP_l$ and the components of the second message $UP_p$. An auxiliary component is referred to as a "Bubble". A Bubble denoted by $B_t[u][v]$ refers to the Bubble obtained from the component $UP_l[u]$ comprised in the first message $UP_l$ and the component $UP_p[v]$ comprised in the second message $UP_p$. The index u varies in $0, 1, \ldots, n_1-1$ and the index v varies in $0, 1, \ldots, n_p-1$. A Bubble $B_t[u][v]=(B_t^{\oplus}[u][v], B_t^+[u][v])$ is a component comprising:

a symbol denoted by $B_t^{\oplus}[u][v]$, and its reliability metric denoted by $B_t^+[u][v]$.

In addition, a binary vector denoted by $B_t^{DBV}[u][v]$ may be associated with the Bubble $B_t[u][v]$.

The total number of considered Bubbles varies between $n_t$ and $n_l \times n_p$, i.e. may be higher than or equal to $n_t$ and lower than or equal to $n_l \times n_p$.

According to some embodiments, the elementary check node processor 26 may be configured to determine the symbol $B_t^{\oplus}[u][v]$ of an auxiliary component $B_t[u][v]$ by applying an addition operation over the algebraic structure of construction of the error correcting code. For codes constructed over Galois fields, the addition operation is performed over the Galois Field GP(q). The addition operation is applied to the symbol $UP_l^\oplus[u]$ comprised in the component $UP_l[u]$ of the first message $UP_l$ and to the symbol $UP_l^\oplus[v]$ comprised in the component $UP_p[v]$ of the second processed message $UP_p$ such that:

$$B_t^\oplus[u][v]=UP_l^\oplus[u]\oplus UP_p^\oplus[v] \qquad (11)$$

According to some embodiments, the elementary check node processor 26 may be configured to determine the reliability metric $B_t^+[u][v]$ of an auxiliary component $B_t[u][v]$, by applying an addition operation over a given algebraic structure, to the reliability metric $UP_l^+[u]$ comprised in the component $UP_l[u]$ of the first message $UP_l$ and to the reliability metric $UP_p^+[v]$ comprised in the component $UP_p[v]$ of the second message $UP_p$ such that:

$$B_t^+[u][v]=UP_l^+[u]+UP_p^+[v] \qquad (12)$$

According to some embodiments, the elementary check node processor 26 may be configured to determine the binary vector $B_t^{DBV}[u][v]$ in association with the auxiliary component $B_t[u][v]$ by applying a vector concatenation operation. The vector concatenation operation may be applied to the binary vector $UP_l^{DBV}[u]$ associated with the component $UP_l[u]$ of the first message $UP_l$ and to the binary vector $UP_p^{DBV}[v]$ associated with the component $UP_p[v]$ of the second message $UP_p$ such that:

$$B_t^{DBV}[u][v]=(U_l^{DBV}[u]\|U_p^{DBV}[v]) \qquad (13)$$

In equation (13), the operator ∥ stands for the concatenation operation which provides, from two or more input scalars or vectors, a list in the form of a vector, the elements of the list being equal to the concatenated inputs.

At a second step, the elementary check node processor 26 may be configured to sort the determined auxiliary components (Bubbles) according to a given order of the reliability metrics of the symbols comprised in these components.

At a third step, the elementary check node processor 26 may be configured to select, among the sorted auxiliary components, the $n_t$ components comprising the most reliable symbols, which provides the intermediate message $UP'_t$ and the binary vector associated with each component of the $n_t$ components comprised in this intermediate message.

Further, the number $n_t$ of components comprised in an intermediate message may be lower than the number of considered Bubbles.

The presorting of the variable node messages using the one or more vector permutations $\pi_t$ represents several advantages in combination with the elementary computations using the elementary check node processors 26. The operations performed by the elementary check node processing units 26 may be simplified. The elementary check node processing units 26 may have accordingly different architectures in the sense that they perform different operations, thus enabling high speed implementations with reduced complexity while offering optimal error decoding performance.

Accordingly, in some embodiments, the check node processor 25-cn may comprise at least one elementary check node processor 26 configured to determine an intermediate message from a first message $UP_l$ comprising two or more components (i.e. $n_l \geq 2$) and a second message $UP_p$ comprising one component (i.e. $n_p=1$), the determined intermediate message $UP'_t$ comprising at least two intermediate components (i.e. $n_t \geq 2$). Such elementary check node processors 26 are referred to as 'S-1B'.

In some embodiments, the check node processor 25-cn may comprise at least one elementary check node processor 26 configured to determine an intermediate message from a first message $UP_l$ comprising two or more components (i.e. $n_l \geq 2$) and a second message $UP_p$ comprising two components (i.e. $n_p=2$), the determined intermediate message $UP'_t$ comprising at least three intermediate components (i.e. $n_t \geq 3$). Such elementary check node processors 26 are referred to as 'S-1B+1'.

Further, in some embodiments, the check node processor 25-cn may comprise at least one elementary check node processor 26 configured to determine an intermediate message from a first message $UP_l$ comprising one component (i.e. $n_1=1$) and a second message $UP_p$ comprising one component (i.e. $n_p=1$), the determined intermediate message $UP'_t$ comprising one intermediate component (i.e. $n_t=1$). Such elementary check node processors 26 are referred to as '1B'.

According to some embodiments, the elementary check node processors 26 may be implemented in a serial architecture.

Figure 5:
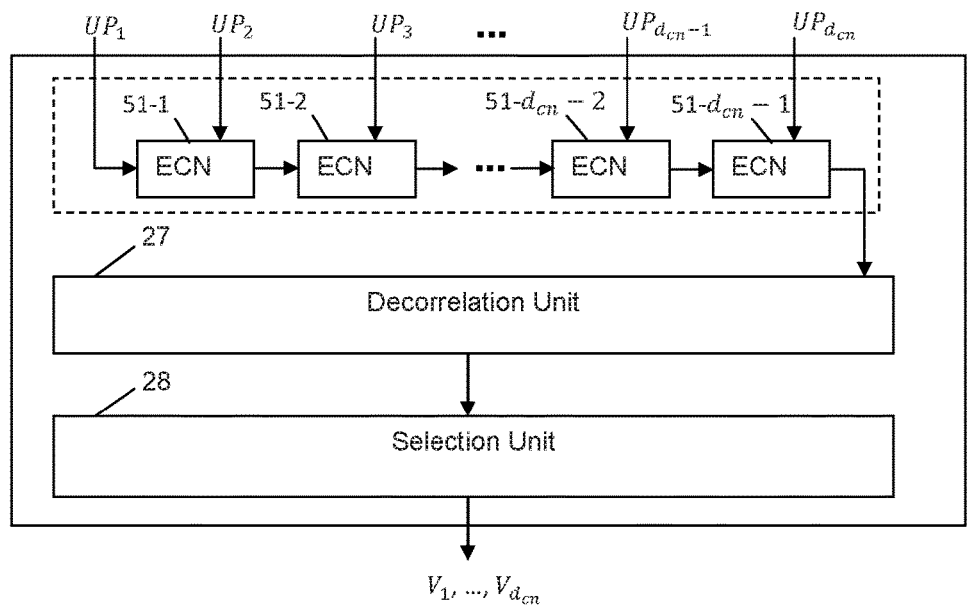
FIG. 5 is a block diagram illustrating the structure of a check node processing unit, according to some embodiments in which the elementary check node processors are implemented in a serial architecture.

FIG. 5 shows a structure of a check node processing unit 25-cn of degree $d_{cn}$ comprising $d_{cn}-1$ elementary check node processors 51-$l$ for $l=1, \ldots, d_{cn}-1$ implemented in a serial architecture. In particular, the check node processing unit 25-cn may comprise an elementary check node processor 51-1 configured to determine an intermediate message and the associated intermediate binary vector with each component of the intermediate message by processing two permuted messages $UP_1$ and $UP_2$. The remaining elementary check node processors 51-$l$ for $l=2, \ldots, d_{cn}-1$ may be each configured to determine an intermediate message and the intermediate binary vector associated with each component of the intermediate message by processing one permuted message and one intermediate message previously determined by an elementary check node processor 51-$a$ for $a=1, \ldots, l-2$ operating at a previous stage in the serial architecture.

According to some other embodiments, the elementary check node processors 26 may be implemented in tree architecture. In such embodiments, the check node processing unit 25-cn may comprise at least one elementary check node processor 26 configured to determine an intermediate message and the intermediate binary vector associated with each component of the intermediate message by processing two permuted messages. The remaining elementary check node processors 26 may be configured to determine an intermediate message and the intermediate binary vector associated with each component of the intermediate message either by processing two permuted messages or by processing two intermediate messages previously determined by two elementary check node processors 26 operating at previous stages of the tree architecture.

Figure 6:
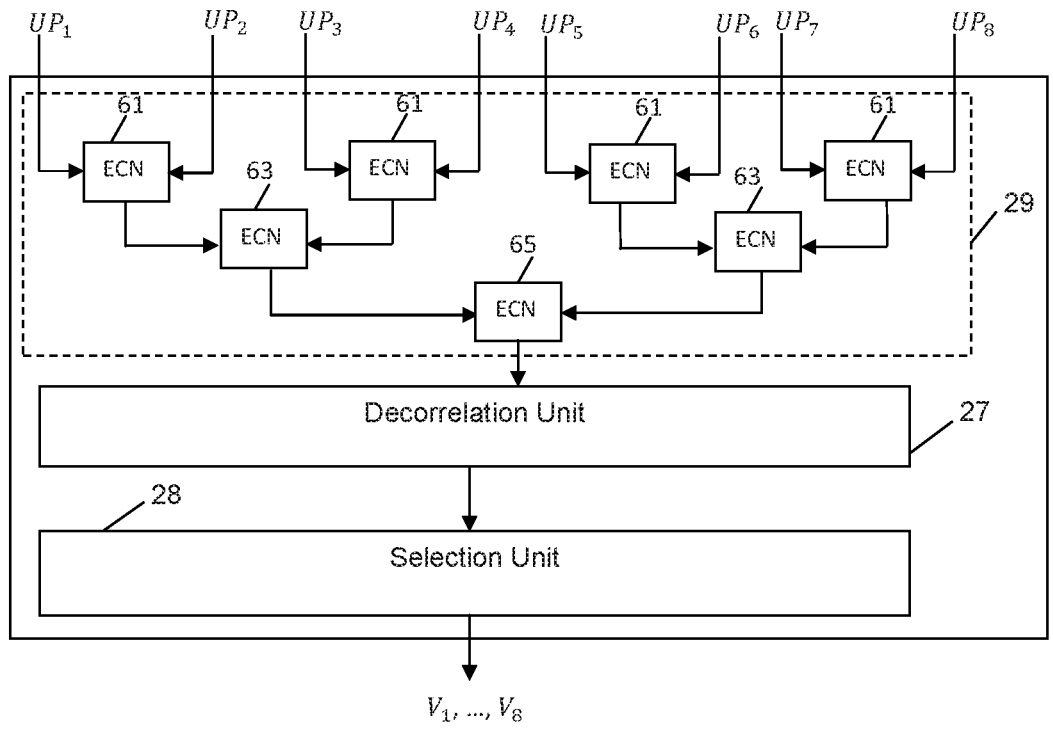
FIG. 6 is a block diagram illustrating the structure of a check node processing unit, according to some embodiments in which the elementary check node processors are implemented in a tree architecture.

FIG. 6 shows a structure of a check node processing unit 25-cn of degree $d_{cn}=8$ implementing $d_{cn}-1$ elementary check node processors in a tree architecture. As shown, the tree architecture comprises 3 stages (hereinafter referred to as 'layers'). The elementary check node processors 61 comprised at the first layer may be configured each to determine an intermediate message by processing two permuted messages. The elementary check node processors 63 comprised at the second layer may be each configured to determine an intermediate message by processing two intermediate messages delivered by the elementary check nodes 61 in the first layer of the architecture. The elementary check node processors 65 comprised at the third layer may be each configured to determine an intermediate message by processing two intermediate messages delivered by the elementary check nodes 63 in the second layer of the architecture.

Figure 7:
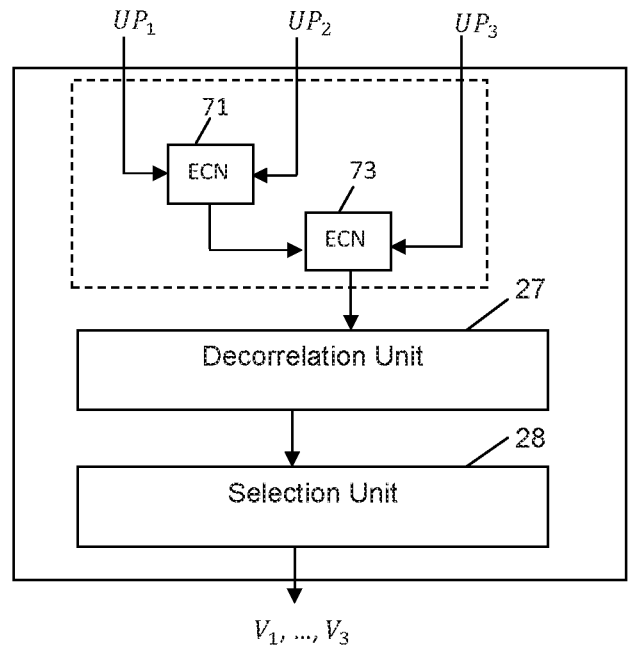
FIG. 7 is a block diagram illustrating the structure of a check node processing unit according to some embodiments in which the elementary check node processors are implemented in a hybrid architecture.

According to some other embodiments, the check node processing unit 25-cn may comprise $d_{cn}-1$ elementary check node processors 26 implemented in a hybrid architecture mixing the serial and the tree architectures as depicted for example in FIG. 7. In such embodiments, the check node processing unit 25-cn may comprise at least one elementary check node processor 71 configured to determine an intermediate message and the intermediate binary vector associated with each component of the intermediate message by processing two permuted messages and at least one elementary check node processor 73 configured to determine an intermediate message and the intermediate binary vector associated with each component of the intermediate message by processing a permuted message and the intermediate message generated by the elementary check node processors 71 located at a previous stage of the hybrid architecture.

According to some embodiments, the set of syndromes $S=\{S_1, S_2, \ldots, S_{NS}\}$ may be determined from the intermediate message computed from all the permuted messages.

For example, in embodiments using a serial architecture of the elementary check node processors as illustrated in FIG. 5, the set of syndromes may be determined from the intermediate message delivered by the elementary check node processor $51\text{-}d_{cn}-1$.

In another example using a tree architecture, as exemplified in FIG. 6, the set of syndromes may be determined from the intermediate message delivered by the elementary check node processor 65 located at the last stage of the tree architecture.

A syndrome denoted by $S_r=(S_r^{\oplus}, S_r^{+}, S_r^{DBV})$ for $r=1,\ldots,NS$ may comprise a GF(q) symbol denoted by $S_r^{\oplus}$, the reliability metric associated with this symbol and denoted by $S_r^{+}$, and a binary vector denoted by $S_r^{DBV}$.

Accordingly, a symbol $S_r^{\oplus}$ comprised in the syndrome $S_r$ for $r=1,\ldots,NS$ can be expressed as a function of the symbols comprised in the permuted messages according to:

$$S_r^{\oplus}=S_r^{\oplus}(u_1,u_2,\ldots,u_{d_j})=UP_1^{\oplus}[u_1]\oplus UP_2^{\oplus}[u_2]\oplus \ldots \oplus UP_{d_{cn}-1}^{\oplus}[u_{d_{cn}-1}]\oplus UP_{d_{cn}}^{\oplus}[u_{d_{cn}}] \quad (14)$$

In equation (14), each index $u_i$ for $i=1,\ldots,d_{cn}$ varies in the set $\{0, 1, \ldots, n_{m,in}-1\}$.

Further, the reliability metric $S_r^{+}$ associated with the symbol $S_r^{\oplus}$ can be expressed as a function of the reliability metrics comprised in the different components of the permuted messages according to:

$$S_r^+ = S_r^+(u_1, u_2, \ldots, u_{d_j}) = \\ UP_1^+[u_1] + UP_2^+[u_2] + \ldots + UP_{d_{cn}-1}^+[u_{d_{cn}-1}] + UP_{d_{cn}}^+[u_{d_{cn}}] \quad (15)$$

Moreover, the binary vector $S_r^{DBV}$ comprised in the syndrome $S_r$ may be written as a function of the initial binary values associated with each component of the permuted message according to:

$$S_r^{DBV}=S_r^{DVB}(u_1,u_2,\ldots,u_{d_j})=(UP_1^{DBV}[u_1]\|\ldots\|UP_{d_{cn}}^{DBV}[U_{d_{cn}}]) \quad (16)$$

According to equation (16), a binary vector $S_r^{DBV}$ comprised in a syndrome $S_r$ comprises $d_{cn}$ bits.

According to some embodiments, the number of syndromes NS may be greater than or equal to the number of components in each permuted message and may depend on the order of the Galois Field.

For example, in GF(64), the number of syndromes may be given by $NS=3n_{m,out}=10\,n_{m,in}$, the number of components comprised in each check node message being typically equal to $n_{m,out}=20$. In another example considering GF(256), the number of syndromes may be given by $NS=3n_{m,out}=20n_{m,in}$, the number of check node components comprised in each check node message being typically equal to $n_{m,out}=60$.

Still in another example for GF(1024), the number of syndromes may be given by $NS=3n_{m,out}=45n_{m,in}$, the number of check node components comprised in each check node message being typically equal to $n_{m,out}=150$.

Given the determined set of syndromes $S=\{S_1, S_2, \ldots, S_{NS}\}$, the check node components $V_i[j]$ comprised in the check node messages $V_i$, to be delivered to the variable node processing unit in association with the variable nodes in the set $\mathcal{H}_c$ (cn), may be determined by:

1) determining, from the set of syndromes, a set of candidate check node components depending on the binary vectors comprised in the set of syndromes, the candidate check node components comprising one or more components comprising a symbol and a reliability metric. In some embodiments, the candidate check node components may comprise two or more components comprising a same symbol, and 2) selecting a number of check node components $n_{m,out}$ from the determined set of candidate check node components depending on the reliability metrics associated with the symbols, the check node components comprising distinct symbols.

Accordingly, the check node processing unit 25-cn may comprise a decorrelation unit 27 configured to determine, in association with each check node message $V_i$, the set of candidate check node components denoted by $V'_i$ from the determined set of NS syndromes S. Each candidate check node component $V'_i[z]=(v'_i^{\oplus}[z], V'_i^{+}[z])$ comprising a symbol $V'_i^{\oplus}[z]$ and the reliability metric $V'_i^{+}[z]$ associated with the symbol.

More specifically and according to some embodiments (not depicted in the figures), the decorrelation unit 27 may comprise $d_{cn}$ elementary decorrelation units, each elementary decorrelation unit being associated with a check node message $V_i$ and being configured to determine the set of candidate check node components $V'_i$ depending on the binary vectors comprised in each syndrome of the set of syndromes S.

The binary vectors called Discard Binary Vectors (DBVs) may be accordingly used to indicate for which output edge a syndrome should be discarded and therefore not selected by the decorrelation unit 27. More precisely, an elementary decorrelation unit may be configured to determine a set of candidate check node components $V'_i$ in association with each check node message $V_i$ by selecting, among the determined set of syndromes S, the syndromes comprising binary vectors $S_r^{DBV}=(S_r^{DBV}[1]\|S_r^{DBV}[2], \ldots \|S_r^{DBV}[d_{cn}])$ such that the bit $S_r^{DBV}[i]$ associated with the check node message $V_i$ is equal to a given value. A reading of the bit in the binary vector comprised in a syndrome may be used to validate or not validate the selection of the syndrome so as to determine the set of candidate check node components in association with a given check node message. Each elementary decorrelation unit may be accordingly configured to determine the set of candidate check node components $V'_i$ from the symbols and their reliability metrics comprised in the selected valid syndromes, the candidate check node components corresponding to the components comprised in the validated syndromes and the number of components in the set of candidate check node components being equal to the number of selected valid syndromes.

According to an embodiment, an elementary decorrelation unit may be configured to determine a set of candidate check node components $V'_i$ in association with each check node message $V_i$ by selecting, among the determined set of syndromes S, the syndromes comprising binary vectors $S_r^{DBV}=(S_r^{DPV}[1]\|S_r^{DBV}[2], \ldots, \|S_r^{DBV}[d_{cn}])$ such that the bit $S_r^{DBV}[i]$ associated with the check node message $V_i$ is equal to zero ('0').

According to another embodiment, an elementary decorrelation unit may be configured to determine a set of candidate check node components $V'_i$ in association with each check node message $V_i$ by selecting, among the determined set of syndromes S, the syndromes comprising binary vectors $S_r^{DBV}=(S_r^{DBV}[1]\|S_r^{DBV}[2], \ldots, \|S_r^{DBV}[d_{cn}])$ such that the bit $S_r^{DBV}[i]$ associated with the check node message $V_i$ is equal to one ('1').

The valid syndromes selected to determine the set of candidate check node components $V'_i$ comprise $NVS_i \leq NS$ valid syndromes, denoted by VS[z] for $z=0, \ldots, NVS_i-1$. A valid syndrome $VS[z]=(VS^\oplus[z], VS^+[z], VS^{DBV}[z])$ comprises a symbol $VS^\oplus[z]$, the reliability metric $VS^+[z]$ associated with the symbol, and a binary vector denoted by $VS^{DBV}[z]$. The valid syndromes are sorted according to an order (increasing or decreasing) of the reliability metrics $VS^+[z]$ such that the valid symbol comprising the most reliable symbol corresponds to VS[0] and that $VS^+[z] \leq VS^+[z+1]$ for $z=0, \ldots, NVS_i-2$.

Given the valid syndromes, the candidate check node components $V'_i[z]=(V_i^\oplus[z], V'_i{}^+[z])$ for $z=0, \ldots, NVS_i-1$ may be determined from the values of the symbols $VS^\oplus[z]$ and the reliability metrics $VS^+[z]$ comprised in the selected valid syndromes. More specifically, the symbol $V'_i{}^\oplus[z]$ comprised in the candidate check node component $V'_i[z]$ may be determined according to:

$$V'_i{}^\oplus[z]=VS^\oplus[z]\oplus UP_i^\oplus[0] \quad (17)$$

The reliability metric $V'_i{}^+[z]$ comprised in the candidate check node component $V'_i[z]$ may be determined by:

$$V'_i{}^+[z]=VS^+[z] \quad (18)$$

The check node processing 25-cn may further comprise a selection unit 28 configured to select $n_{m,out}$ check node components from the determined set of candidate check node components $V'_i$ depending on the reliability metrics $V'_i{}^+[z]$ associated with the symbols $V'_i{}^\oplus[z]$., the set of candidate check node components $V'_i$ comprising $NVS_i$ components.

According to some embodiments, the selection unit 28 may be configured to select $n_{m,out}$ check node components comprising distinct symbols from the set of candidate check node components. Accordingly, the selection unit 28 may be first configured to perform a redundancy elimination in the set of candidate check node components $V'_i$ for keeping, among the components comprising the same symbol (i.e. among the components comprising redundant symbols), the one which comprises the most reliable symbol. In a second step, the selection unit 28 may be configured to select $n_{m,out} \leq NVS_i$ components from the processed candidate check node components, depending on the reliability metrics of the symbols comprised in the processed candidate check node components, such that the $n_{m,out}$ components comprising the most reliable distinct symbols are selected.

According to other embodiments, the selection unit 28 may be configured to select the $n_{m,out}$ check node components from the determined candidate check node components $V'_i$ by performing only the redundancy elimination in the set of candidate check node components $V'_i$. In other words, the selected $n_{m,out}$ check node components may correspond to the candidate check node components $V'_i[z]$ that comprise distinct symbols. In embodiments in which the set of candidate check node components $V'_i$ does not comprise components having a same symbol, the selected $n_{m,out}$ check node components may correspond to the components comprised in the selected valid syndromes, $n_{m,out}$ being in this case equal to the number of valid syndromes, i.e. $n_{m,out}=NVS_i$.

According to other embodiments, the selection unit 28 may be configured to select the $n_{m,out}$ check node components from the determined candidate check node components $V'_i$ without performing a redundancy elimination among the candidate check node components comprising redundant symbols. In such embodiments, the selection unit 28 may be configured to select, among the $NVS_i$ check node components, the most reliable $n_{m,out} \leq NVS_i$ components.

Still in other embodiments, the selection unit 28 may be configured to select $n_{m,out}=NVS_i$ check node components from the determined candidate check node components $V'_i$ without performing a redundancy elimination, the number $n_{m,out}$ of check node components being equal to the number $NVS_i$ of the selected valid syndromes and the selected check node components corresponding to the components comprised in the selected valid syndromes, It should be noted that in embodiments in which the selection unit 28 does not perform a redundancy elimination, the check node components may comprise two or more components comprising a same symbol. In such embodiments, the redundancy elimination may be performed at the level of the variable node processing units receivers of the check node messages. According to some embodiments, the selection units 28 implemented in the various check node processing units 25-cn for cn varying in $1, \ldots, n-k$ may be configured to select a same number $n_{m,out}$ of check node components to determine the check node messages.

According to other embodiments, the selection units 28 implemented in one or more of the check node processing units 25-cn may be configured to select a different number $n_{m,out}$ of check node components to determine the check node messages. In such embodiments, the variables node processing units 27-vn recipients of these check node messages may be configured to perform a truncation operation to retain a same number of components in each received message.

Further, according to some embodiments, the number $n_{m,out}$ of check node components may be different from the number $n_{m,in}$ of components in the permuted messages, or equivalently in the variable node messages. In particular, the number of check node components may satisfy $n_{m,out} \geq n_{m,in}$.

In some embodiments, the number $n_{m,out}$ of check node components may depend on the number of components $n_{m,in}$ comprised in the permuted messages.

The number $n_{m,out}$ of check node components may further depend on the error correcting code (e.g. the algebraic structure over which the code is constructed) and/or on the order of the decoding iteration of the iterative decoding process and/or on the signal-to-noise ratio and/or on the computational and storage capabilities of the check node processing units 215-cn.

In some other embodiments, the number $n_{m,out}$ of check node components may depend on a combination of the factors previously cited.

For example, for Galois Fields over GF(64), the number $n_{m,out}$ of check node components may be related to the number of components comprised in the permuted messages according to $n_{m,out}=3n_{m,in}$. For Galois Fields over GF(1024), the number $n_{m,out}$ of check node components may be related to the number of components comprised in the permuted messages according to $n_{m,out}=15n_{m,in}$.

The check node processing unit 25-cn may be configured to deliver the check node messages to their corresponding variable node processing units after performing a switching operation corresponding to reverse of the vector permutation operations performed to permute the variable node messages. The switching operation enables to associate each check node message with its corresponding variable node processing unit 23-vn associated with the variable nodes in the set $\mathcal{H}_c(cn)$ for each check node processing unit 25-cn.

According to some embodiments, the check node processing unit 25-cn may be configured to send the check node messages to the signal estimation unit 29. The signal estimation unit 29 being configured to:

- send the check node messages to the variable node processing units 23-vn recipients of the check node messages if a maximum number of iterations is not yet reached and the parity-check equation is not satisfied; or
- deliver the processed signal as an estimate of the original codeword if the processed signal satisfies the parity-check equation; or
- declare a decoding failure but nevertheless output the codeword estimated at the last iteration if a maximum number of iterations is reached without meeting all parity-check constraints.

Figure 8:
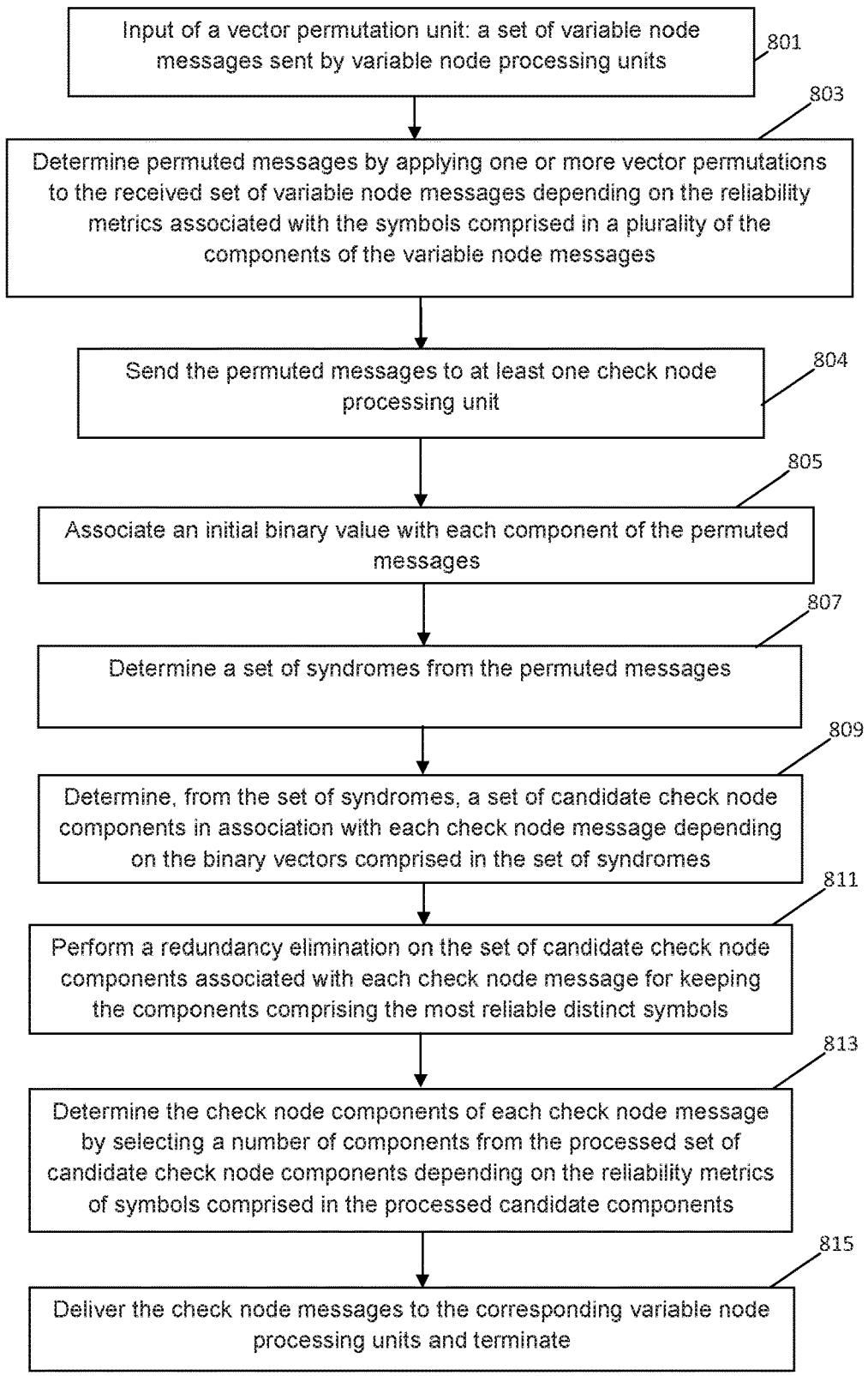
FIG. 8 is a flowchart depicting a method of determining check node messages at a check node processing unit from presorted variable node messages based on syndrome decoding using a plurality of elementary check node processors, according to some embodiments.

FIG. 8 is a flowchart illustrating a method of determining check node messages at a check node processing unit implemented in the EMS algorithm for decoding non-binary LDPC codes according to various embodiments in which presorted syndrome decoding involving elementary computations using a plurality of elementary check node processors is performed at the check node processing unit. The variable node messages sent by variable node processing units to check node processing units are accordingly presorted according to the reliability metrics of symbols comprised in the components of the variable node messages.

The following description of some embodiments will be made with reference to soft-output decoding and reliability metrics represented in the logarithm domain by log-likelihood ratio (LLR) values, for illustration purposes only. However, the skilled person will readily understand that other types of decoding and reliability metrics may be used to measure the reliability of symbols.

The method of the computation of check node messages at a check node processing unit is a part of the messages exchange performed during the iterative decoding process of the EMS algorithm. The decoding process may be performed to determine an estimate e of an original codeword c from a received noisy sequence represented by a vector $y=(y_1, \ldots, y_n)$ by applying the Belief Propagation decoding rule. The codeword $c=(c_1, \ldots, c_n)$ may have been encoded at the transmitter using a non-binary LDPC code designated by $\mathcal{C}$ (n,k) constructed over the Galois Field GF(q) with q>2.

The LLR is a metric measuring the reliability of a symbol. One definition of the LLR metric involves a fixed reference symbol. A reference symbol of the symbol $c_i$ noted $\beta_i$ may correspond to the most reliable symbol satisfying:

$$\beta_i = \mathrm{argmax}_{t=0,\ldots,q-1} p(\alpha_t|y_i) \quad (19)$$

In equation (19), $\alpha_t$ designates a GF symbol.

Using such definition of the LLR metric, the most reliable symbols are those that have smallest LLR values. Accordingly, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t | y_i)}{p(c_i = \beta_i | y_i)}\right) \quad (20)$$

For the clarity of the presentation, the following description of some embodiments will be made with a focus on the processing at a check node processing unit receiving permuted messages that have been generated by a vector permutation unit from a set of variable node messages. A notation at the level of a check node processing unit of degree $d_{cn}$ configured to receive $d_{cn}$ sorted and truncated permuted messages $UP_1, UP_2, \ldots, UP_{d_{cn}}$ and to generate $d_{cn}$ check node messages $V_1, V_2, \ldots, V_{cn}$ will be considered in the following.

Step 801 may be performed at the level of the vector permutation unit configured to permute the variable node messages to be sent to a check node processing unit from the variable node processing units corresponding to the connected variable nodes in the Tanner graph. Accordingly, a set of $d_{cn}$ variable node messages $U_1, U_2, \ldots, U_{d_{cn}}$ may be received. Variable node messages may be sorted and truncated. Accordingly, each variable node message may comprise $n_{m,in} \ll q$ components sorted in a given order of the reliability metrics comprised in each component. In particular, in embodiments in which the LLR is the metric measuring the reliability of a symbol, the most reliable symbols are those which have the smallest LLR values. Accordingly, each variable node message $U_i$ may be written in a vector notation according to $$U_i = \begin{pmatrix} U_i[n_{m,in}-1] \\ \vdots \\ U_i[1] \\ U_i[0] \end{pmatrix}$$

such that each component $U_i[j]=(U_i^{\oplus}[j], U_i^+[j])$ for $j=0, \ldots, n_{m,in}-1$ comprises a symbol denoted by $U_i^{\oplus}[j]$ and the LLR metric denoted by $U_i^+[j]$ associated with the symbol and that the component carrying the most reliable symbol corresponds to the component $U_i[0]$, for $i=1, \ldots, d_{cn}$ and that $U_i^+[u] \leq U_i^+[v]$ for each $0 \leq u < v \leq n_{m,in}-1$.

A check node message $$V_i = \begin{pmatrix} V_i[n_{m,in}-1] \\ \vdots \\ V_i[1] \\ V_i[0] \end{pmatrix}$$

may be a vector comprising $n_{m,out}$ check node components. A check node component $V_i[j]=(V_i^{\oplus}[j], V_i^+[j])$ for $j=0, \ldots, n_{m,out}-1$ comprises a symbol and the LLR metric associated with said symbol. Similarly to the variable node messages, each check node message may be sorted according to an increasing order of the LLR metrics such that the check node component comprising the most reliable symbol corresponds to the component $V_i[0]$, for $i=1, \ldots, d_{cn}$ and that $V_i^+[j+1] \geq V_i^+[j]$ for $j=0, \ldots, n_{m,out}-2$.

The set of variable node messages may be written $UIN=(U_1, U_2, \ldots, U_{d_{cn}})$ and expressed as in equation (3).

Step 803 may be performed to determine permuted messages $UP_1, UP_2, \ldots, UP_{d_{cn}}$ by applying one or more vector permutations $\pi_t$, for $t=1, \ldots$, Tmax, to the set of variable node messages depending on the reliability metrics $U_i^+[j]$ associated with the symbols $U_i^{\oplus}[j]$ comprised in the variable node messages $U_1, U_2, \ldots, U_{d_{cn}}$, each vector permutation $\pi_t$ being associated with a permutation index $j_t$, the permutation index taking value between 1 and $n_{m,in}$.

More specifically, a vector permutation $\pi_t$ may be applied to permute two or more of the variable node messages in the set UIN according to the reliability metrics of the components $U_i[j_t]$ corresponding to the component comprising the $j^{th}$ most reliable symbol.

The determination of permuted messages using a vector permutation $\pi_t$ may be performed in four steps:
1) extracting, from the set of variable node messages UIN, the vector $P^t$ corresponding to the components $U_i[j_t]$ according to equations (4) and (5);
2) determining a vector $SP^t$ by sorting the vector $P^t$ in a given order of the reliability metrics $U_i^+[j_t]$ comprised in the components $U_i[j_t]$ for $i=1, \ldots, d_{cn}$. The sorting may be performed in an increasing or decreasing order of the reliability metrics. In particular, in embodiments in which the reliability of the symbols is measured by the LLR metrics, the sorting of the vector $P^t$ may be performed in an increasing order of the metrics $U_i^+[j_t]$;
3) determining, from the generated vector $SP^t$, the permutation $\pi_t$ associated with the sorting of the vector $P^t$ such that the sorted vector $SP^t$ can be expressed as in equation (7), and
4) applying the permutation $\pi_t$ to the set of variable node messages to obtain the set $UP^t$.

According to some embodiments, the number Tmax of the one or more vector permutations $\pi_t$ may be predefined.

According to other embodiments, the number Tmax of the one or more vector permutations $\pi_t$ may be determined depending on at least one parameter chosen in a group consisting of a signal-to-noise ratio, the number $n_{m,in}$ of components comprised in the variable node messages $U_{i,i=1,\ldots,d_{cn}}$, the error correcting code $\mathcal{C}$ (n,k) (e.g. the algebraic structure of construction of the code), and the number of iterations of the iterative decoding process.

Further, in some embodiments, a permutation index $j_t$ may be determined depending on the number of variable node messages, i.e. on the degree of the check node processing unit 25-cn, and/or on the reliability metrics comprised in some of the components of the variable node messages and/or on the algebraic structure of construction of the error correcting code $\mathcal{C}$ (n,k) (e.g. on the order of the Galois field for codes constructed over Galois fields).

In particular embodiments, the number Tmax of the vector permutations may be equal to one, i.e. Tmax=1 corresponding to a single permutation $\pi_1$. In such embodiments, the permutation index may be advantageously equal to 1, i.e. $j_1=1$. Accordingly, the variable node vectors may be permuted such that the components $U_1[1], U_2[1], \ldots, U_{d_{cn}}[1]$ are sorted in a given order of the reliability metrics $U_i^+[1]$ for $i=1, \ldots, d_{cn}$. In particular, the variable node vectors may be permuted such that the components $U_1[1], U_2[1], \ldots, U_{d_{cn}}[1]$ are sorted in an increasing order of the LLR values.

It should be noted that the number $n_{m,in}$ of components in the variable node messages is the same as the number of components in the permuted messages. In addition, each of the permuted messages is sorted in a given order of the reliability metrics of the components $UP_i[j]=(UP_i^{\oplus}[j], UP_i^+[j])$ for $j=0, \ldots, n_{m,in}-1$. In particular, each permuted message may be sorted in an increasing order of the LLR metrics such that the component carrying the most reliable symbol corresponds to the component $UP_i[0]$, for $i=1, \ldots, d_{cn}$ and that $UP_i^+[u] \leq UP_i^+[v]$ for each $0 \leq u < v \leq n_{m,in}-1$.

Step 804 may be performed to send the determined permuted messages $UP_1, UP_2, \ldots, UP_{d_{cn}}$ to at least one check node processing unit 25-cn which is configured to receive the at least three variable node messages, before being presorted in step 803, from the variable node processing units associated with the variable nodes in the set $\mathcal{H}_c(cn)$. The permuted messages may be advantageously at least equal to three messages.

Step 805 may be performed to associate an initial binary value with each component $UP_i[j]$ for $j=0, \ldots, n_{m,in}-1$ comprised in the permuted messages $UP_i$ for $i=1, \ldots, d_{cn}$.

According to some embodiments, the initial binary value associated with the components $UP_i[j]$ may depend on the reliability metrics $UP_i^+[j]$ associated with the symbols $UP_i^{\oplus}[j]$ comprised in said components. In particular, an initial binary value equal to a predefined first value may be associated with the component comprising the most reliable symbol and an initial binary value equal to a predefined second value may be associated with the remaining components.

According to some embodiments, the predefined first value may be equal to zero ('0') and the predefined second value may be equal to one ('1'). In such embodiments, the binary value associated with a component $UP_i[j]$ may be denoted by $UP_i^{DBV}[j]$ and may be given by equation (9).

According to other embodiments, the predefined first value may be equal to one ('1') and the predefined second value may be equal to one ('0'). Accordingly, the initial binary value associated with a component comprised in a permuted message maybe equal to bit '1' if the symbol comprised in this component is the most reliable symbol, as given by equation (10).

Step 807 may be performed to determine a set of syndromes denoted by $S=\{S_1, S_2, \ldots, S_N\}$ comprising NS syndromes from the permuted messages using a plurality of elementary check node processors 26. A syndrome $S_r=(S_r^{\oplus}, S_r^+, S_r^{DBV})$ for $r=1, \ldots$, NS may comprise a symbol denoted by $S_r^{\oplus}$, the LLR metric associated with the symbol and denoted by $S_r^+$, and a binary vector denoted by $S_r^{DBV}$.

According to some embodiments, the set of syndromes S may be determined from intermediate messages determined individually by each elementary check node processor 26. More specifically, the set of syndromes may be determined by the intermediate message determined from all the permuted messages.

An intermediate message denoted by $UP'_t$ may comprise a number $n_t$ of sorted intermediate components and an intermediate binary vector associated with each intermediate component, the intermediate components comprised in a given intermediate message being sorted into an increasing order of the LLR metrics associated with the symbols comprised therein.

According to some embodiments, an intermediate message may be determined by processing a first message and a second message derived from the permuted messages.

Accordingly, in some embodiments, a symbol comprised in an intermediate component of an intermediate message by applying an addition operation over the Galois Field (in general over the structure over which the error correcting code is constructed), said addition operation being applied to the symbol comprised in a component of the first message and to the symbol comprised in a component of the second message.

Moreover, the LLR metric associated with a symbol comprised in an intermediate component of an intermediate message may be determined by applying an addition operation over a given algebraic structure, the addition operation being applied to the reliability metric comprised in a component of the first message and the reliability metric comprised in a component of the second message.

According to some embodiments, the algebraic structure may be chosen in a group consisting of the field $\mathbb{R}$ of real numbers, the field $\mathbb{Z}$ of integer numbers, and the field $\mathbb{N}$ of natural numbers.

For example in quantized hardware implementations and software implementations, the reliability metric associated with the symbol comprised in an intermediate component of an intermediate message may be determined by applying an addition operation over the integer field $\mathbb{Z}$ or the field of natural numbers $\mathbb{N}$, enabling a complexity reduction.

Further, in some embodiments, each component of the first message and the second message may be associated with a binary vector derived from the initial binary values. In such embodiments, the intermediate binary vector associated with an intermediate component may be determined by applying a vector concatenation operation, the vector concatenation operation being applied to the binary vector associated with a component of the first message and to the binary vector associated with a component of the second message.

Depending on the stage of the computation of the intermediate message, the first and second messages may correspond to permuted messages or to at least one intermediate message previously determined during the elementary computations.

According to some embodiments in which the first message and second message are different from the permuted messages, the number $n_l$ of components processed from the first message and/or the number $n_p$ of components processed from the second message may correspond to the number of components comprised in the previous intermediate messages.

For an intermediate message determined by processing two permuted messages denoted respectively by $UP_l$ and $UP_p$ for l and $p \neq l$ varying in the set of indices from 1 to $d_{cn}$, an intermediate message denoted by $UP'_t$ may be determined from the components of the permuted messages. The intermediate binary vector associated with each intermediate component of the intermediate message may be determined from the initial binary values associated with each component of the permuted messages. Accordingly, an intermediate message $UP'_t$ may comprise $n_t$ components $UP'_t[j]$ for $j=0, \ldots n_t-1$ and an intermediate binary vector $UP'_t[j]$ associated with each intermediate component $UP'_t[j]$. A component $UP'_t[j]=(UP_t^{\oplus}[j], UP_t^{+}[j])$ for $j=0, \ldots n_t-1$ may comprise a symbol $UP'_t[j]$ and the LLR metric $UP'_t^{+}[j]$ associated with the symbol.

The intermediate components comprised in an intermediate message may be sorted according to a given order depending on the reliability metrics of the symbols comprised therein such that $UP'_t^{+}[j+1] \geq UP'_t^{+}[j]$ for all $j=0, \ldots, n_t-2$.

According to some embodiments, an intermediate message may be determined by processing a number $n_l \leq n_{m,in}$ of components from the first message and/or a number $n_p \leq n_{m,in}$ of components from the second message.

According to some embodiments, an intermediate message may be determined through three steps as in the following.

At a first step, a set of auxiliary components may be determined from the components of the first message $UP_l$ and the components of the second message $UP_p$. An auxiliary component is referred to as a "Bubble". A Bubble denoted by $B_t[u][v]$ refers to the Bubble obtained from the component $UP_l[u]$ comprised in the first message $UP_l$ and the component $UP_p[v]$ comprised in the second message $UP_p$. The index u varies in $0, 1, \ldots, n_l-1$ and the index v varies in $0, 1, \ldots, n_p-1$. A Bubble $B_t[u][v]=(B_t^{\oplus}[u][v], B_t^{+}[u][v])$ is a component comprising:

a symbol denoted by $B_t^{\oplus}[u][v]$, and its reliability metric denoted by $B_t^{+}[u][v]$.

In addition, a binary vector denoted by $B_t^{DBV}[u][v]$ may be associated with the Bubble $B_t[u][v]$.

The total number of considered Bubbles varies between $n_t$ and $n_l \times n_p$, i.e. may be higher than or equal to $n_t$ and lower than or equal to $n_l \times n_p$.

According to some embodiments, the symbol $B_t^{\oplus}[u][v]$ comprised in an auxiliary component $B_t[u][v]$ for $u=0, 1, \ldots, n_1-1$ and $v=0, 1, \ldots, n_p-1$ may be determined according to the addition over the Galois Field as previously expressed in equation (11).

According to some embodiments, the LLR metric $B_{t+}[u][v]$ comprised in an auxiliary component $B_t[u][v]$ for $u=0, 1, \ldots, n_1-1$ and $v=0, 1, \ldots, n_p-1$ may be determined according to the addition over the Real Field as previously expressed in equation (12).

According to some embodiments, the binary vector $B_t^{DBV}[u][v]$ associated with an auxiliary component $B_t[u][v]$ for $u=0, 1, \ldots, n_1-1$ and $v=0, 1, \ldots, n_p-1$ may be determined according to the vector concatenation operation as previously expressed in equation (13).

After the computation of the $n_l \times n_p$ auxiliary components, a sorting step may be performed to order these components in an increasing order of the LLR metrics comprised in each auxiliary component.

In a last step, a truncation operation may be performed to select, among the $n_l \times n_p$ sorted auxiliary components, $n_t$ components, which provides the intermediate message $UP'_t$ and the binary vector associated with each component of the $n_t$ sorted intermediate components comprised in this intermediate message.

According to some embodiments, the number $n_t$ of the components comprised in an intermediate message $UP_t$ may be lower than the total number of considered Bubbles.

In particular, interesting simplifications in terms of the number of Bubbles that may be retained to obtain an intermediate message may be achieved thanks to the pre-sorting of the variable node messages.

For example, in some embodiments, an intermediate message $UP'_t$ comprising at least two intermediate components (i.e. $n_t \geq 2$) may be determined from a first message $UP_l$ comprising two or more components (i.e. $n_l \geq 2$) and a second message $UP_p$ comprising one component (i.e. $n_p=1$).

In another example, an intermediate message $UP'_t$ comprising at least three intermediate components (i.e. $n_t \geq 3$) may be determined from a first message $UP_l$ comprising two or more components (i.e. $n_l \geq 2$) and a second message $UP_p$ comprising two components (i.e. $n_p=2$).

Still in another example, in some embodiments an intermediate message $UP'_t$ comprising one intermediate component (i.e. $n_t=1$) may be determined from a first message $UP_l$ comprising one component (i.e. $n_l=1$) and a second message $UP_p$ comprising one component (i.e. $n_p=1$).

The set of syndromes may be determined from the intermediate message computed using all the permuted messages.

In embodiments using a serial architecture, the set of syndromes may be determined from the intermediate message delivered from the last elementary computation that may be performed by the last elementary check node processor in the architecture.

In embodiments using a tree architecture, the set of syndromes may be determined from the intermediate message delivered by the elementary check node processor located in the last stage of the tree architecture.

Irrespective of the type of the implementation architecture of the various elementary check node processors 26 configured to perform the elementary computations for delivering the intermediate messages, the set of syndromes $S_r=(S_r^\oplus, S_r^+, S_r^{DBV})$ for $r=1, \ldots, NS$ may be expressed as a function of the permuted messages.

Accordingly, the symbol SP comprised in the syndrome $S_r$ for $r=1, \ldots, NS$ may be expressed as the summation over the Galois field of the symbols $UP_i^\oplus[u_i]$ comprised in the permuted messages $UP_i$ for $i=1, \ldots, d_{cn}$ and $u_i \in [0, n_{m,in}-1]$ according to equation (14).

Further, the LLR metric $S_r^+$ comprised in the syndrome $S_r$ for $r=1, \ldots, NS$ may be expressed as the summation over an algebraic structure of the LLR metrics $UP_i^+[u_i]$ comprised in the permuted messages $UP_i$ for $i=1, \ldots, d_{cn}$ and $u_i \in [0, n_{m,in}-1]$ according to equation (15). The algebraic structure may correspond to the field of real numbers, or the field of integer numbers, or the field of natural numbers.

Further, the binary vector $S_r^{DBV}$ comprised in the syndrome $S_r$ for $r=1, \ldots, NS$ may be expressed as the vector concatenation of the initial binary values $UP_i^{DBV}[u_i]$ associated with the permuted messages $UP_i$ for $i=1, \ldots, d_{cn}$ and $u_i \in [0, n_{m,in}-1]$ according to equation (16). Accordingly, the binary vector $S_r^{DBV}$ comprised in a syndrome $S_r$ comprises $d_{cn}$ bits, each binary value $S_r^{DBV}[i]$ for $i=1, \ldots, d_i$ being associated with a check node message $V_i$.

According to some embodiments, the number of syndromes NS may be greater than or equal to the number of components in each permuted message and/or may depend on the order of the Galois Field.

For example, in GF(64), the number of syndromes may be given by $NS=3n_{m,out}=10n_{m,in}$, the number of components comprised in each check node message being typically equal to $n_{m,out}=20$.

In another example considering GF(256), the number of syndromes may be given by $NS=3n_{m,out}=20n_{m,in}$, the number of check node components comprised in each check node message being typically equal to $n_{m,out}=60$.

Still in another example for GF(1024), the number of syndromes may be given by $NS=3n_{m,out}=45n_{m,in}$, the number of check node components comprised in each check node message being typically equal to $n_{m,out}=150$.

Step 809 may be performed to determine a set of candidate check node components denoted by $V'_i$ in association with each check node message $V_i$ from the determined set of syndromes by applying a decorrelation operation that depends on the binary vector $S_r^{DBV}$ comprised in each syndrome $S_r$. The binary vectors may accordingly indicate for which check node message, a syndrome must be discarded or selected for determining the set of candidate check node components. As a binary vector $S_r^{DBV}$ comprises $d_{cn}$ bits, each bit $S_r^{DBV}[i]$ for $i=1, \ldots, d_{cn}$ being associated with a check node message $V_i$, the value of the bit $S_r^{DBV}[i]$ may be used to validate or not the selection of the syndrome $S_r$ for determining the set of candidate check node components $V'_i$.

According to an embodiment, the syndromes comprising binary vectors $S_r^{DBV}=(S_r^{DBV}[1]\|S_r^{DBV}[2], \ldots \|S_r^{DBV}[d_{cn}])$ such that the bit $S_r^{DBV}[i]$ associated with the check node message $V_i$ is equal to zero ('0') may be selected as valid syndromes.

According to another embodiment, the syndromes comprising binary vectors $S_r^{DBV}=(S_r^{DBV}[1]\|S_r^{DBV}[2], \ldots \|S_r^{DBV}[d_{cn}])$ such that the bit $S_r^{DBV}[i]$ associated with the check node message $V_i$ is equal to one ('1') may be selected as valid syndromes.

The valid syndromes selected to determine the set of candidate check node components $V'_i$ comprise $NVS_i \leq NS$ valid syndromes, denoted by $VS[z]$ for $z=0, \ldots, NVS_i-1$. A valid syndrome $VS[z]=(VS^\oplus[z], VS^+[z], VS^{DBV}[z])$ comprises a symbol $VS^\oplus[z]$, the reliability metric $VS^+[z]$ associated with the symbol, and a binary vector denoted by $VS^{DBV}[z]$. The valid syndromes are sorted according to an order (increasing or decreasing) of the reliability metrics $VS^+[z]$ such that the valid symbol comprising the most reliable symbol corresponds to $VS[0]$ and that $VS^+[z] \leq VS^+[z+1]$ for $z=0, \ldots, NVS_i-2$.

The candidate check node components $V'_i[z]=(V'_i^\oplus[z], V'_i^+[z])$ may be determined from the symbols and their reliability metrics comprised in the $NVS_i$ selected valid syndromes. More specifically, the symbol $V'_i^\oplus[z]$ comprised in the candidate check node component $V'_i[z]$ may be determined according to equation (17) and the reliability metric $V'_i^+[z]$ comprised in the candidate check node component $V'_i[z]$ may be determined according to equation (18).

In some embodiments, the determined candidate check node components may comprise two or more components that comprise a same symbol.

At step 811, a redundancy elimination operation may be performed on the determined set of candidate check node components associated with each check node message for retaining, from the components comprising the same symbol, the component comprising the most reliable symbol corresponding to the smallest LLR metric. In other words, the components that give rise to a same symbol value are processed such that the component comprising the redundant symbol associated with the smallest LLR metric is kept.

Step 813 may be performed to generate the check node components of check node messages $V_i$ for $i=1, \ldots, d_{cn}$ from the processed sets of candidate check node components. The check node components of a check node message $V_i$ may be determined by selecting a number $n_{m,out}$ of the most reliable components from the processed set of candidate check node components, i.e. by selecting the $n_{m,out}$ components comprising the symbols associated with the smallest LLR metrics.

According to some embodiments, the number $n_{m,out}$ of check node components may be different from the number $n_{m,in}$ of components in the permuted messages, or equivalently in the variable node messages. In particular, the number of check node components may satisfy $n_{m,out} \geq n_{m,in}$.

In some embodiments, the number $n_{m,out}$ of check node components may depend on the number of components $n_{m,in}$ comprised in the permuted messages.

The number $n_{m,out}$ of check node components may further depend on the algebraic structure over which the code is constructed and/or on the order of the decoding iteration of the iterative decoding process and/or on the signal-to-noise ratio and/or on the computational and storage capabilities of the check node processing units 215-*cn*.

In some other embodiments, the number $n_{m,out}$ of check node components may depend on a combination of the factors previously cited.

For example, for Galois Fields over GF(64), the number $n_{m,out}$ of check node components may be related to the number of components comprised in the permuted messages according to $n_{m,out}=3n_{m,in}$. For Galois Fields over GF(1024), the number $n_{m,out}$ of check node components may be related to the number of components comprised in the permuted messages according to $n_{m,out}=15n_{m,in}$.

Step 815 may be performed to deliver the check node messages to their corresponding variable node processing units. A switching operation corresponding to reverse of the vector permutation operations performed to permute the variable node messages may be performed to associate each check node message with its corresponding variable node processing unit.

It should be noted that flowchart 8 illustrates the processing at the level of a check node processing unit 25-cn receiving a set of permuted messages derived from the variable node processing units associated with the variable nodes in the set $\mathcal{H}_c(cn)$. As the processing at the check node processing units is a part of the iterative decoding process, the delivered check node messages may be further processed (for example by the signal estimation unit 29) in order to check if the parity-check equation is satisfied and decide wither to continue the iterative decoding process or to stop. More specifically:
- if a maximum number of iterations is not yet reached and the parity-check equation is not satisfied, the check node messages delivered by the check node processing units 25-cn for cn=1, . . . , n–k may be sent to the variable node processing units 23-vn recipients of the check node messages;
- if the processed signal satisfies the parity-check equation, the decoding process may terminate and the processed signal may be delivered as an estimate of the original codeword;
- if a maximum number of iterations is reached without meeting all parity-check constraints, a decoding failure may be declared and the codeword estimated at the last iteration may be output as an estimate of the original codeword.

The proposed architectures allow thus to provide optimal decoding performance with a significant reduction of the decoding computational complexity and implementation hardware cost in addition to a significant improvement in terms of latency.

Figures 9, 10:
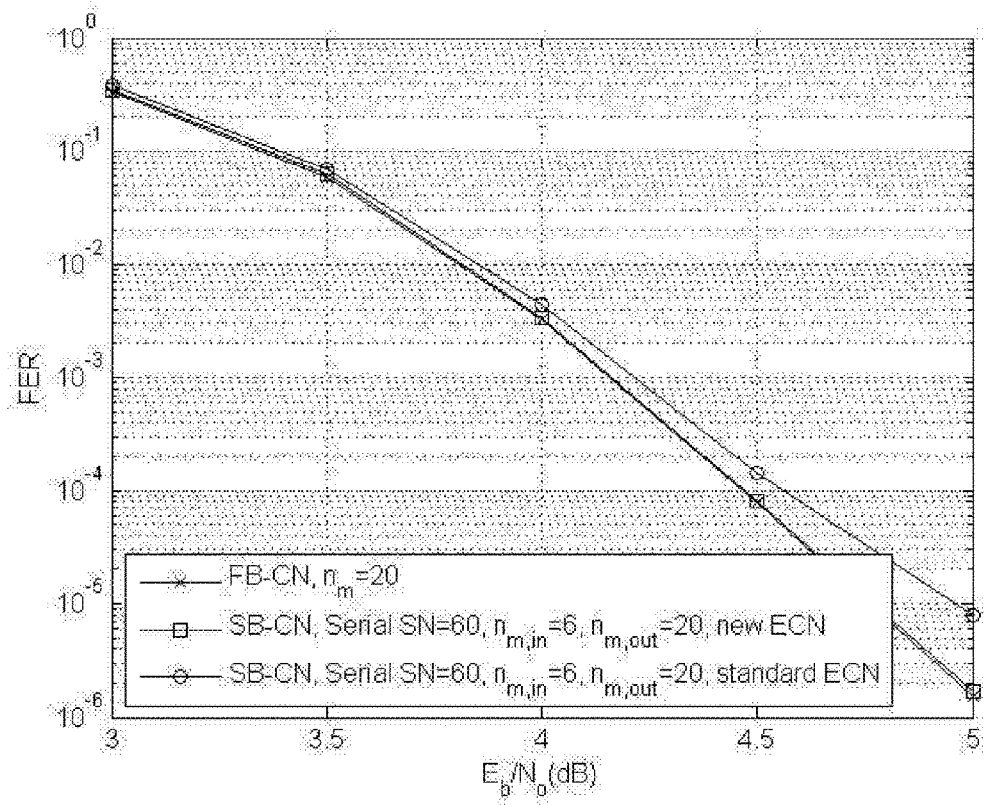
FIG. 9 is a diagram illustrating the Frame Error Rate obtained using a non-binary LDPC iterative decoder in a Gaussian transmission channel, according to some embodiments in which a NB-LDPC code constructed over Galois Field GF(64) and of a coding rate 5/6 is used.
FIG. 10 is a table illustrating the complexity in terms of the number of elementary check node processors and the number of inputs and outputs of the elementary check node processors, according to some embodiments in which a NB-LDPC code constructed over Galois Field GF(64) and of a coding rate 5/6 is used.

FIG. 9 illustrates the error probability performance evaluated in terms of the Frame Error Rate (FER) of decoding a (576,480) non-binary LDPC code constructed over GF(64) under the AWGN channel using the EMS algorithm according to some embodiments using 10 iterations of the messages exchange process between the variable and check nodes. The FER is evaluated for three implementations of the EMS algorithm:
1. 'FB-CN,$n_m$=20' (in FIG. 9 $n_m$ designates $n_{m,in}$) refers to embodiments using the prior-art forward backward architecture based on the S-Bubble algorithm where elementary check node processors represented by ($n_f$=20, $n_p$=20, $n_t$=20) are used.
2. 'SB-CN, Serial NS=60, $n_{m,in}$=6, $n_{m,out}$=20, new ECN' refers to some embodiments of the invention in which a presorting of the variable node messages is applied in combination with a serial implementation of 11 elementary check node processors 26 are used. The corresponding serial implementation comprises five (5) elementary check node processor 26 of type 1B represented by the tuple ($n_f$=1, $n_p$=1, $n_t$=1) and one elementary check node processor 26 of type S-1B represented by the tuple ($n_f$=2, $n_p$=1, $n_t$=2).
3. 'SB-CN, Serial, NS=60, $n_{m,in}$=6, $n_{m,out}$=20 Standard ECN' refers to embodiments in which a presorting of the variable node messages is applied in combination with a serial implementation of the elementary check node processors 26 where the elementary check node processors 26 perform the traditional operations used in the existing forward backward architecture.

It should be noted that the conventional operations performed by an elementary check node processor, in contrast to the operations performed by an elementary check node processor according to the embodiments of the present invention, involve a redundancy elimination operation that removes redundant components from auxiliary components or Bubbles.

Depicted error performance results show that the proposed presorted serial implementations of syndrome decoding using elementary check node processors provide a same performance as the forward-backward architecture, which shows the optimality of the methods according to the embodiments of the invention. In addition, numerical results show the efficiency of the elementary check node processors according to the various embodiments against the operations used in the conventional elementary check node processors. Indeed, when applied to syndrome computation, the processing performed by conventional elementary check node processors fails to achieve optimal error performance and presents a significant loss especially at high signal-to-noise ratio values. This performance loss is due to the redundancy elimination operation performed at the level of the elementary check node processors.

In addition to the error probability performance, the complexity of the following implementations was evaluated in terms of the number of elementary check node processors (ECNs), the number of sorted input components, and the total number of the ENCs outputs: 'Forward-Backward architecture', 'Tree SB-CN', and 'Serial SB-CN', 'Sorted Tree SB-CN', and 'Sorted serial SB-CN'. The results are shown in FIG. 10 and are based on the same settings as the decoding process corresponding to the results plotted in FIG. 9. Numerical results show the reduced complexity of the proposed Sorted Serial and Tree SB-CN implementations of the syndrome-based decoder compared to the existing forward backward architectures. The architectures according to the embodiments of the invention use a lower number of elementary check node processors. Compared to the existing forward backward architecture, the number of ECNs is reduced from 3($d_{cn}$–2) to ($d_{cn}$–1), the number of ECNs inputs is significantly reduced, and the number of the ECNs outputs is also greatly decreased, with architectures according to some embodiments of the invention.

FIG. 11 is a table illustrating the complexity in terms of the number of slices in a FPGA implementation and latency (in number of cycles) of some simplified elementary check node processors obtained according to some embodiments of the invention in which a presorting of the variable node messages is used. The complexity of the elementary check node processors of the types '1B', 'S-1B' and 'S-1B+1' is compared to the complexity of elementary check node processors of types 'S-2B' and 'S-4B' corresponding to ECNs architectures of the existing S-Bubble algorithm. Numerical results show that the simplified architectures as proposed in some embodiments of the invention provide lower latency and significantly reduced numbers of occupied slices, while offering optimal decoding performances.

FIG. 12 is a table illustrating the complexity in terms of the number of occupied slices and latency (in number of cycles) of check node processing units implementing three implementations of the EMS algorithm: 'Forward-Backward' referring to the existing Forward-Backward architecture, 'Serial SB-CN' corresponding to an elementary check node processing-based syndrome decoding without presorting of the variable node messages, and 'Sorted serial SB-CN' referring to a presorted syndrome decoding using elementary check node processors according to some embodiments of the invention. Depicted results show the latency improvement provided by the presorting process (when comparing the Serial SB-CN to the proposed Sorted serial SB-CN) and the reduction in terms of the number of occupied slices using the proposed Sorted serial SB-CN compared to the existing Forward-Backward architecture and to the serial SB-CN which does not implement a presorting of the variable node messages.

The architectures according to the embodiments of the invention accordingly provide optimal decoding performances with a significant reduction of the decoding computational complexity and implementation hardware cost.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

In particular, while the description of some embodiments of the invention has been performed with reference to a particular implementation to the EMS algorithm, it should be noted that the invention may be also applied to other iterative decoding algorithms such as the min-max algorithm.

Furthermore, while some embodiments of the invention have been described with reference to error correcting codes constructed over Galois Fields, the skilled person will readily understand that the proposed embodiments based on elementary check node processing for syndrome computation may be also applied to any LDPC codes and any graph error correcting code constructed over non-commutative groups such as polynomial codes (e.g. cyclic codes).

Further, even if the invention has some advantages in an application to communication systems, it should be noted that the invention is not limited to such communication devices and may be integrated in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A decoder for determining an estimate of an encoded signal, the decoder comprising one or more variable node processing units and one or more check node processing units configured to exchange messages, each message comprising one or more components, a component comprising a symbol and a reliability metric associated with said symbol, wherein the decoder comprises:
   at least one vector permutation unit configured to receive a set of at least three variable node messages comprising variable node components from at least one variable node processing unit and to generate permuted messages depending on a plurality of the reliability metrics comprised in said variable node components, the variable node messages being sorted according to an order of the reliability metrics; and
   at least one check node processing unit configured to:
      calculate at two or more elementary check node processors a set of syndromes from said at least three permuted messages, a syndrome comprising a binary vector,
      generate at least one check node message from said set of syndromes depending on said binary vector, and
      send said at least one check node message to a signal estimation unit.

2. The decoder of claim 1, wherein the permuted messages are determined by applying one or more vector permutations to the set of at least three variable node messages, a permutation index being associated with each vector permutation, the vector permutation unit being configured to extract components of the at least three variable node messages according to the permutation index, said vector permutation being applied to permute the at least three variable node messages according to a given order of the reliability metrics of the extracted components.

3. The decoder of claim 2, wherein the number of the vector permutations is predefined.

4. The decoder of claim 2, wherein said at least one variable node processing unit is configured to exchange at least three messages with said at least one check node processing unit during a number of iterations, said signal being encoded using at least one error correcting code, the number of the vector permutations is determined depending on at least one parameter chosen in a group consisting of a signal-to-noise ratio, a number of components comprised in the variable node messages, the at least one error correcting code, and said number of iterations.

5. The decoder of claim 2, wherein the permutation index associated with a vector permutation depends on the number of the variable node messages and/or on the reliability metrics comprised in a plurality of the components of the variable node messages and/or on at least one error correcting code.

6. The decoder of claim 1, wherein a syndrome comprises a symbol, a reliability metric associated with said symbol, and a binary vector, each elementary check node processor being configured to determine an intermediate message from a first message and a second message, said first message and second message being derived from said at least three permuted messages, said intermediate message comprising one or more sorted intermediate components and an intermediate binary vector associated with each intermediate component, each intermediate component comprising a symbol and a reliability metric associated with said symbol, said one or more intermediate components being sorted according to an order of the reliability metrics associated with the symbols, the two or more elementary check node processors being configured to calculate said set of syndromes from the intermediate message determined from all of said at least three permuted messages.

7. The decoder of claim 6, comprising at least one elementary check node processor configured to determine the symbol comprised in an intermediate component by applying an addition operation over an algebraic structure of construction of at least one error correcting code, the addition operation being applied to the symbol comprised in a component of said first message and to the symbol comprised in a component of said second message.

8. The decoder of claim 6, wherein at least one elementary check node processor is configured to determine the reliability metric associated with a symbol comprised in an intermediate component by applying an addition operation over a given algebraic structure, said addition operation being applied to the reliability metric associated with a symbol comprised in a component of said first message and to the reliability metric associated with a symbol comprised in a component of said second message, said given algebraic structure being chosen in a group consisting of a field of real numbers, a field of integer numbers, and a field of natural numbers.

9. The decoder of claim 6, wherein each component comprised in said at least three permuted messages is associated with an initial binary value, each component of said first message and second message being associated with a binary vector derived from said initial binary values, at least one elementary check node processor being configured to determine the intermediate binary vector associated with each intermediate component of said intermediate message by applying a vector concatenation operation, said vector concatenation operation being applied to the binary vector associated with a component of said first message and to the binary vector associated with a component of said second message.

10. The decoder of claim 9, wherein said initial binary value depends on the reliability metrics associated with the symbols, for each permuted message, the component of said permuted message comprising the most reliable symbol being associated with an initial binary value equal to a predefined first value and the remaining components of said permuted message being associated with an initial binary value equal to a predefined second value.

11. The decoder of claim 10, wherein said predefined first value is equal to zero and said predefined second value is equal to one.

12. The decoder of claim 10, wherein said predefined first value is equal to one and said predefined second value is equal to zero.

13. The decoder of claim 6, wherein said at least one check node processing unit comprises at least one elementary check node processor configured to determine an intermediate message from a first message comprising two or more components and a second message comprising one component, said intermediate message comprising at least two intermediate components.

14. The decoder of claim 6, wherein said at least one check node processing unit comprises at least one elementary check node processor configured to determine an intermediate message from a first message comprising two components and a second message comprising two or more components, the determined intermediate message comprising at least three intermediate components.

15. The decoder of claim 6, wherein said at least one check node processing unit comprises at least one elementary check node processor configured to determine an intermediate message comprising one intermediate component, said one intermediate component being determined from a most reliable component comprised in a first message and a most reliable component comprised in a second message.

16. The decoder of claim 15, wherein said at least one check node processing unit is configured to determine check node components comprised in a check node message associated with at least one variable node processing unit by:
  determining, from the set of syndromes, a set of candidate check node components depending on the binary vectors comprised in said set of syndromes, the candidate check node components comprising one or more components, each component comprising a symbol and a reliability metric associated with the symbol, and
  selecting a predefined number of components from said set of candidate check node components depending on the reliability metrics associated with the symbols, which provides the check node components of said check node message associated with at least one variable node processing unit.

17. The decoder of claim 16, wherein the candidate check node components comprise two or more components comprising a same symbol.

18. The decoder of claim 17, wherein said check node components comprise distinct symbols.

19. The decoder of claim 1, comprising a vector permutation unit in association with each check node processing unit.

20. The decoder of claim 1, comprising two or more check node processing units, the decoder comprising one vector permutation unit in association with a plurality of said two or more check node processing units.

21. The decoder of claim 20, wherein said elementary check node processors are implemented in a serial architecture.

22. The decoder of claim 1, wherein said elementary check node processors are implemented in a tree architecture.

23. The decoder of claim 1, wherein said elementary check node processors are implemented in a hybrid architecture comprising one or more elementary check node processors implemented in a serial architecture and one or more elementary check node processors implemented in a tree architecture.

24. The decoder of claim 4, wherein said at least one error correcting code is a non-binary error correcting code.

25. A decoding method for determining an estimate of an encoded signal, said decoding comprising exchanging of messages between one or more variable node processing units and one or more check node processing units, each message comprising one or more components, a component comprising a symbol and a reliability metric associated with said symbol, wherein the method comprises:
  receiving a set of at least three variable node messages comprising variable node components and generating permuted messages depending on a plurality of the reliability metrics comprised in said variable node components, the variable node messages being sorted according to an order of the reliability metrics;
  calculating a set of syndromes from said at least three permuted messages, a syndrome comprising a binary vector, generating at least one check node message from said set of syndromes depending on said binary vector, and determining an estimate of said encoded signal from at least one check node message.

\* \* \* \* \*